(12) United States Patent
Srinivasan et al.

(10) Patent No.: US 11,714,131 B1
(45) Date of Patent: Aug. 1, 2023

(54) CIRCUIT AND METHOD FOR SCAN TESTING

(71) Applicant: STMicroelectronics International N.V., Geneva (CH)

(72) Inventors: Venkata Narayanan Srinivasan, Greater Noida (IN); Manish Sharma, Gurgaon (IN); Shiv Kumar Vats, Greater Noida (IN); Umesh Chandra Srivastava, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/699,900

(22) Filed: Mar. 21, 2022

(51) Int. Cl.
  *G01R 31/3185* (2006.01)
  *G01R 31/317* (2006.01)
  *G01R 31/3177* (2006.01)

(52) U.S. Cl.
  CPC ........... *G01R 31/318533* (2013.01); *G01R 31/318552* (2013.01); *G01R 31/3177* (2013.01); *G01R 31/31725* (2013.01)

(58) Field of Classification Search
  CPC .... G01R 31/318533; G01R 31/318552; G01R 31/31725; G01R 31/3177
  See application file for complete search history.

(56) References Cited

U.S. PATENT DOCUMENTS

| | | | |
|---|---|---|---|
| 7,155,651 B2 | 12/2006 | Nadeau-Dostie et al. | |
| 7,512,851 B2 | 3/2009 | Wang et al. | |
| 7,882,410 B2 | 2/2011 | Ayres et al. | |
| 8,887,019 B2 | 11/2014 | Chakravadhanula et al. | |
| 9,021,323 B1* | 4/2015 | Dastidar | G01R 31/318544 714/727 |
| 9,128,154 B2 | 9/2015 | Cesari | |
| 9,222,979 B2 | 12/2015 | Kim | |
| 9,264,049 B2 | 2/2016 | Bahl et al. | |
| 9,740,234 B1 | 8/2017 | Kim et al. | |
| 9,915,933 B2 | 3/2018 | Kim | |

(Continued)

OTHER PUBLICATIONS

S. Wu et al., "Logic BIST Architecture Using Staggered Launch-on-Shift for Testing Designs Containing Asynchronous Clock Domains," 2010 IEEE 25th International Symposium on Defect and Fault Tolerance in VLSI Systems, Kyoto, Japan, 2010, pp. 358-366. (Year: 2010).*

(Continued)

*Primary Examiner* — Cynthia Britt
(74) *Attorney, Agent, or Firm* — Slater Matsil, LLP

(57) ABSTRACT

In an embodiment, a method for performing scan testing includes: generating first and second scan clock signals; providing the first and second scan clock signals to first and second scan chains, respectively, where the first and second scan clock signals includes respective first shift pulses when a scan enable signal is asserted, and respective first capture pulses when the scan enable signal is deasserted, where the first shift pulse of the first and second scan clock signals correspond to a first clock pulse of a first clock signal, where the first capture pulse of the first scan clock signal corresponds to a second clock pulse of the first clock signal, and where the first capture pulse of the second scan clock signal corresponds to a first clock pulse of a second clock signal different from the first clock signal.

20 Claims, 14 Drawing Sheets

(56) References Cited

U.S. PATENT DOCUMENTS

| | | |
|---|---|---|
| 2010/0251045 A1 | 9/2010 | Hapke et al. |
| 2012/0124423 A1* | 5/2012 | Chakravadhanula ........................ G01R 31/31727 714/E11.17 |
| 2012/0173943 A1* | 7/2012 | Cesari ................ G01R 31/3177 714/E11.155 |
| 2015/0204945 A1 | 7/2015 | Sanghani et al. |
| 2021/0279391 A1 | 9/2021 | Hasegawa |
| 2022/0018902 A1 | 1/2022 | Cote |

OTHER PUBLICATIONS

D. Track and R. Fisette, "Recursive hierarchical DFT methodology with multi-level clock control and scan pattern retargeting," 2016 Design, Automation & Testin Europe Conference & Exhibition (DATE), Dresden, Germany, 2016, pp. 1128-1131. (Year: 2016).*

P. Shanmugasundaram and V. D. Agrawal, "Dynamic scan clock control in BIST circuits," 2011 IEEE 43rd Southeastern Symposium on System Theory, Auburn, AL, USA, 2011, pp. 237-242. (Year: 2011).*

Ahmed, N. et al., "At-Speed Transition Fault Testing With Low Speed Scan Enable," VLSI Test Symposium, Proceedings 23rd IEEE, Jun. 2005, 6 pages.

EDN, "Design clock controllers for hierarchical test," https://www.edn.com/design-clock-controllers-for-hierarchical-test/, Jul. 18, 2014, 8 pages.

VLSI Tutorials, "On-chip Clock Controller," https://visitutorials.com/scan-on-chip-clock-controller/, downloaded on Feb. 13, 2022, 4 pages.

VLSI Tutorials, "Scan Clocking Architecture," https://visitutorials.com/dft-scan-clocking-architecture/, downloaded Feb. 13, 2022, 6 pages.

* cited by examiner

PRIOR ART

PRIOR ART
Launch-on-Capture (LOC)

Launch-on-Shift (LOS)

Pipeline LOS

CIRCUIT AND METHOD FOR SCAN TESTING

TECHNICAL FIELD

The present disclosure relates generally to an electronic system and method, and, in particular embodiments, to a circuit and method for scan testing.

BACKGROUND

Integrated circuits (ICs) are generally tested for faults. Logic circuits are commonly tested using a method often referred to as scan testing. During scan testing, patterns are shifted in through one or more chains of flip-flops (also referred to as a scan chains) to stimulate one or more logic circuits. Results from the stimulated logic circuits are loaded into the scan chains and are shifted out for evaluation. When the shifted-out patterns match expected patterns (based on proper functionality of the one or more logic circuits), then no faults are detected and the circuit may be treated as defect-free. When the shifted-out patterns do not match the expected patterns, then faults are detected.

Scan chains are generally implemented with scan flip-flops connected in a chain. FIG. 1A shows an exemplary scan flip-flop. When the SE input (signal $SE_{102}$) is low, each time clock $CLK_{102}$ pulses, the logic value at the D input (signal $D_{102}$) is latched into scan flip-flop 102 and outputted at the Q output (signal $Q_{102}$). When the SE input (signal $SE_{102}$) is high, each time clock $CLK_{102}$ pulses, the logic value at the SI input (signal $SI_{102}$) is latched into scan flip-flop 102 and outputted at the Q output (signal $Q_{102}$). The reset input XR, when asserted (e.g., low), resets the content of the scan flip-flop to a default value (e.g., 0).

The chain of scan flip-flops is typically connected with the Q output of each scan flip-flop being connected to the SI input of the next scan flip-flop (except for the last scan flip-flop). The first scan flip-flop of the scan chain receives a scan input signal (e.g., scan_in). The last scan flip-flop of the scan chain generates a scan output signal (e.g., scan_out). A global scan enable signal (e.g., scan_en) is generally connected to the SE input of each of the scan flip-flops in the scan chain. A global clock signal (e.g., clk) is generally connected to the clock input of each of the scan flip-flops of the scan chain. FIG. 1B shows an exemplary scan chain implemented with scan flip-flops 102.

Scan testing may be performed to check for stuck-at faults. For example, when the scan enable signal (e.g., scan_en) is asserted (e.g., high), the scan chain (e.g., 120) shifts in a scan patter from scan input signal (e.g., scan_in) based on pulses from clock signal (e.g., clk). When the scan enable signal is deasserted (e.g., low), the output of circuits coupled to the D inputs of flip-flops 102 are captured during the next clock pulse (also referred to as a capture pulse). After capture, the scan enable signal is asserted and the content of flip-flops 102 are shifted output based on pulses from the clock signal (e.g., clk) to be evaluated for faults.

Scan testing may be performed to check transition faults using launch-on-capture (LOC), launch-on-shift (LOS), and pipeline LOS.

FIG. 2 shows exemplary LOC waveforms of scan chain clock signal clk and scan enable signal scan_en for driving scan chain 120. As shown in FIG. 2, when scan_en is in a high state (also referred to as high, or logic 1), data (also referred to as test vectors, test patterns, vectors, or patterns) from scan input signal scan_in shifts through the scan chain each time clock signal clk pulses. When scan enable signal scan_en transitions to a low state (also referred to as low, or logic 0), the first pulse of clock signal clk causes the logic circuits having inputs coupled to the scan chain to transition in a step generally referred to as launch. The second pulse of clock signal clk causes the loading of the outputs of the stimulated logic circuits into flip-flops of the scan chain. Once scan enable signal scan_en transitions back to the high state, data in the scan chain 120 shifts out each time clock signal clk pulses. The data shifted out (in scan output signal scan_out) is then evaluated for faults.

The launch and capture clock pulses may be performed at-speed so that the logic circuits are tested for faults related to transition delays.

As can be seen in FIG. 1, LOC testing allows for shifting data into or out of the scan chain at slow speed while still performing at-speed testing of the logic circuits. Thus, in some implementations, LOC testing may allow for an easier implementation of the scan circuit (compared with LOS testing) since the scan enable signal scan_en transition may be slow.

FIG. 3 shows exemplary LOS waveforms of scan chain clock signal clk and scan enable signal scan_en for driving scan chain 120. As shown, LOS testing is very similar to LOC testing. However, LOS testing performs the launch operation during the last shift pulse of clock signal clk. Thus, as shown in FIG. 3, scan enable signal scan_en transitions to the low state after the last shift pulse of clock signal clk but before the capture pulse of clock signal clk.

In a similar manner as in LOC testing, LOS testing may be performed at-speed. Thus, in some implementations, the scan enable signal scan_en implementation is designed to transition fast enough to allow for at-speed testing during LOS.

As can be seen in FIG. 3, in some implementations, LOS testing may allow for faster test time (compared with LOC testing) since LOS testing uses the clock pulse for the last shift for both shifting data through the scan chain and for the launch operation.

FIG. 4 shows exemplary pipeline LOS waveforms of scan chain clock signal clk, scan enable signal scan_en and internal scan enable signal internal_scan_en. As shown in FIG. 4, pipeline LOS testing is a mixture of both LOC and LOS testing. For example, pipeline LOS is similar to LOC since it performs at-speed launch and capture operations with external scan enable signal "scan_en" low. Pipeline LOS is similar to LOS since it performs the launch operation during the last shift pulse of clock signal clk. However, pipeline LOS relies on internal scan enable signal "internal_scan_en" (e.g., forced high) instead of external scan enable signal "scan_en" for the capture operation, where the internal scan enable signal may be delayed (e.g., gated) based, e.g., on timing design constraints. In some implementations, pipeline LOS testing may allow for faster test time (compared with LOC testing) since pipeline LOS testing uses the clock pulse with internal scan enable for the last shift for both shifting data through the scan chain and for the launch operation, and may allow for easier implementation than LOS testing since timing considerations for scan enable signal scan_en may be relaxed.

In some implementations, the internal scan enable signal internal_scan_en may transition from '1' to '0' on the negative edge of the launch clock pulse instead of on the positive edge of the launch clock pulse (as shown in FIG. 4).

Scan testing, e.g., with implementations as illustrated in FIGS. 2-4, may be implemented with an automated test equipment (ATE), where, e.g., the ATE provides the test vectors (scan input signal scan_in) to the IC and evaluates the results (data shifted out from scan output signal scan_out) for determining faults. Scan testing may also be performed as a logic built-in-self-test (LBIST), where the IC applies the test vectors to itself (e.g., using a pseudorandom number generator) and determines whether a fault occurred by using an LBIST controller of the IC.

As illustrated in FIGS. 2-4, two at-speed clock pulses (launch and capture) with a frequency equal to the functional frequency of the device under test (DUT) are used for performing at-speed scan testing (e.g., during testing of the DUT with an ATE). One way of providing the at-speed pulses to a scan chain (e.g., 120) is by providing the at-speed pulses using an ATE via I/O pads of the DUT. Another way of providing at-speed pulses to a scan chain (e.g., 120) is by providing the at-speed pulses using an on-chip clock controller (OCC). An OCC (also referred to as a scan clock controller or SCC) may be understood as a circuit of the DUT that is configured to generate the at-speed clock pulses based on an internal clock signal, such as an internal phase-locked loop (PLL).

For high-frequency clock domains (also referred to as high-frequency domains), generating at-speed pulses for scan testing using an ATE may be challenging because the parasitics of the I/O pads limit the frequency of the signal through the I/O pads. Thus, for high-frequency domains, at-speed pulses for scan testing are generally provided with an OCC.

For low-frequency clock domains (also referred to as low-frequency domains), at-speed pulses for scan testing may be provided with an ATE via I/O pads or with an OCC.

SUMMARY

In accordance with an embodiment, a method for performing scan testing of an integrated circuit includes: receiving a first clock signal from a first pin or pad of the integrated circuit, the first clock signal having a first frequency; receiving a scan enable signal from a second pin or pad of the integrated circuit; generating a second clock signal, the second clock signal having a second frequency at least one order of magnitude higher than the first frequency; generating a first scan clock signal based on the first clock signal and the scan enable signal; generating a second scan clock signal based on the first clock signal, the second clock signal, and the scan enable signal, where the first and second scan clock signals are generated in parallel; providing the first scan clock signal to a first scan chain, where the first scan clock signal includes a first shift pulse when the scan enable signal is asserted, and a first capture pulse when the scan enable signal is deasserted, where the first shift pulse of the first scan clock signal corresponds to a first clock pulse of the first clock signal, and where the first capture pulse of the first scan clock signal corresponds to a second clock pulse of the first clock signal; providing the scan enable signal to a second scan chain; and providing the second scan clock signal to a second scan chain, where the second scan clock signal includes a first shift pulse when the scan enable signal is asserted, and a first capture pulse when the scan enable signal is deasserted, where the first shift pulse of the second scan clock signal corresponds to the first clock pulse of the first clock signal, and where the first capture pulse of the second scan clock signal corresponds to a first clock pulse of the second clock signal.

In accordance with an embodiment, a method includes: receiving a first clock signal from a first pin or pad of an integrated circuit; receiving a scan enable signal from a second pin or pad of the integrated circuit; generating a first scan clock signal based on the first clock signal and the scan enable signal; generating a second scan clock signal based on the first clock signal and the scan enable signal, where the first and second scan clock signals are generated in parallel; providing the scan enable signal and the first scan clock signal to a first scan chain to check transition faults in a first circuit of the integrated circuit using launch-on-shift (LOS) mode, where: when the scan enable signal is asserted, each clock pulse of the first clock signal has a corresponding pulse in the first scan clock signal, and each clock pulse of the first clock signal has a corresponding pulse in the second scan clock signal; and when the scan enable signal is deasserted, each clock pulse of the first clock signal has a corresponding pulse in one of the first and second scan clock signals and does not have a corresponding pulse in the other of the first and second scan clock signals.

In accordance with an embodiment, an integrated circuit includes: a first pin or pad configured to receive a first clock signal, the first clock signal having a first frequency; a second pin or pad configured to receive a scan enable signal; a phase-locked loop (PLL) configured to generate, at an output of the PLL, a second clock signal, the second clock signal having a second frequency at least one order of magnitude higher than the first frequency; a clock control circuit having a first input coupled to the first pin or pad, a second input coupled to the second pin or pad, and an output; an on-chip clock controller having a first input coupled to the first pin or pad, a second input coupled to the second pin or pad, and a third input coupled the output of the PLL, and an output; a first scan chain having a first input coupled to the output of the clock control circuit, and a second input coupled to the second pin or pad; a first circuit coupled to the first scan chain; a second scan chain having a first input coupled to the output of the on-chip clock controller, and a second input coupled to the second pin or pad; and a second circuit coupled to the second scan chain, where the clock control circuit is configured to generate, at the output of the clock control circuit, a first scan clock signal based on the first clock signal and the scan enable signal to check transition faults in the first circuit using launch-on-shift (LOS) mode or pipeline LOS mode, where the on-chip clock controller is configured to generate, at the output of the on-chip clock controller, a second scan clock signal based on the first clock signal, the second clock signal, and the scan enable signal to check transition faults in the second circuit using launch-on-capture (LOC) mode, and where the clock control circuit and the on-chip clock controller are configured to generate the first and second scan clock signals in parallel.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials or the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., a circuit and method for scan testing circuits in a low-frequency domain in parallel with scan testing circuits in a high-frequency domain. Embodiments of the present invention may be used, e.g., without scan testing in parallel a high-frequency domain. Some embodiments may perform scan testing of more than one low-frequency domain (e.g., where each low-frequency domain may be checked in parallel with different scan passes of the high-frequency domain).

In an embodiment of the present invention, at-speed scan testing of circuits in a high-frequency domain is performed in parallel with at-speed scan testing of circuits in a low-frequency domain. An OCC generates a first scan clock for at-speed testing the circuits in the high-frequency domain based on an ATE clock (for shift pulses) received from an ATE, an internal PLL (for at-speed pulses), and a scan enable signal received from the ATE. A clock control circuit generates a second scan clock for at-speed testing the circuits in the low-frequency domain based on the same ATE clock (used for shift and at-speed pulses) and the same scan enable signal received from the ATE. In some embodiments, pulses of the ATE clock that are not to be propagated to the first or second scan clocks are masked.

In some embodiments, at-speed scan testing of circuits in the low-frequency domain is performed in parallel with stuck-at scan testing of circuits in the high-frequency domain by using a single ATE clock and scan enable signal received from the ATE.

Figure 5:
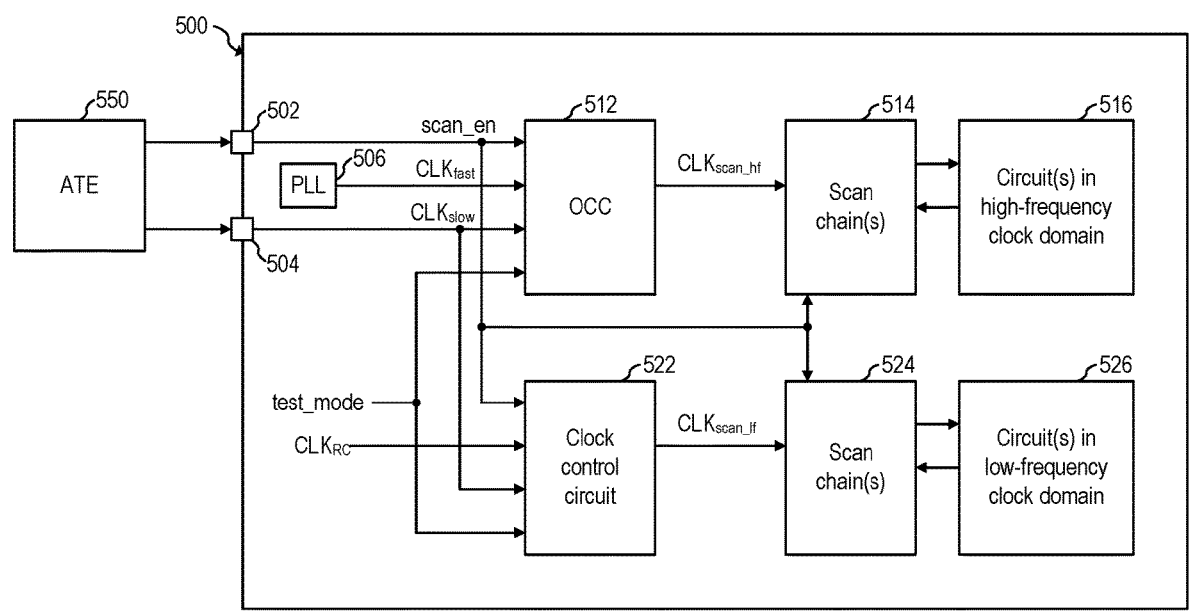
FIG. 5 shows a schematic diagram of an IC, according to an embodiment of the present invention.

Some ICs, such as some system-on-chip (SoCs), such as some microcontrollers, include multiple clock domains. FIG. 5 shows a schematic diagram of IC 500, according to an embodiment of the present invention. IC 500 may be, e.g., a microcontroller, and includes multiple clock domains. IC 500 includes PLL 506, OCC 512, clock control circuit 522, and scan chains 514 and 524. IC 500 also includes a high-frequency domain that includes one or more circuits 516 testable by scan chain(s) 514, and a low-frequency clock domain that includes one or more circuits 526 testable by scan chain(s) 524. IC 500 also includes pins or pads 502 and 504.

In some embodiments, during scan testing, IC 500 receives a scan enable signal scan_en (e.g., from ATE 550) and a slow clock signal $CLK_{slow}$ (e.g., from the ATE 550). In some embodiments, the scan enable signal scan_en and clock signal $CLK_{slow}$ received from ATE 550 are designed for OCC 512 so that OCC 512 generates scan clock $CLK_{scan\_hf}$ for scan testing circuits 516 in the high-frequency domain using scan chains 514.

In some embodiments, clock control circuit 522 generates scan clock $CLK_{scan\_lf}$ for scan testing circuits 526 in the low-frequency domain using scan chains 524. In some embodiments, clock control circuit 522 generates scan clock $CLK_{scan\_lf}$ reusing the same scan enable signal scan_en and clock signal $CLK_{slow}$ designed for OCC 512 to generate, in parallel with scan clock $CLK_{scan\_hf}$, scan clock $CLK_{scan\_lf}$. By generating in parallel the slow and fast scan clocks (e.g., $CLK_{scan\_lf}$ and $CLK_{scan\_hf}$, respectively) from the same scan enable signal (e.g., scan_en) and ATE clock signal (e.g., $CLK_{slow}$), some embodiments advantageously achieve lower test times compared with implementations that perform scan testing of the circuit(s) (e.g., 516) of the high-frequency domain and the circuit(s) (e.g., 526) of the low-frequency domain sequentially (e.g., using different ATPG passes). In some embodiments, such advantages are achieved without using an additional OCC for generating the slow scan clock and/or without using large frequency dividers (e.g., to divide the OCC clock $CLK_{scan\_hf}$), which may advantageously result in a smaller circuit and lower silicon area.

In some embodiments, there is at least one order of magnitude between the functional operating frequencies (e.g., functional clock frequencies) of the high-frequency clock domain (which includes circuit(s) 516) and the low-frequency clock domain (which includes circuit(s) 526). For example, in some embodiments, the high-frequency clock domain has a functional operating frequency of, e.g., 100 MHz, 200 MHz, 400 MHz, 1 GHz, or higher). In some embodiments, the low-frequency clock domain has a functional operating frequency of, e.g., 40 MHz, 10 MHz, 1 MHz, 100 KHz, 32 kHz, 10 kHz, or lower. Other functional operating frequencies may also be used.

In some embodiments, the functional clock signal (e.g., $CLK_{RC}$, e.g., shown in FIG. 7) for the low-frequency clock domain may be provided during normal operation (not in scan) by an internal oscillator, such as an internal RC oscillator. In some embodiments, the functional clock signal for the high-frequency clock domain may be provided during normal operation (not in scan) by PLL 506 and may be, e.g., clock signal $CLK_{fast}$.

Figure 1A:
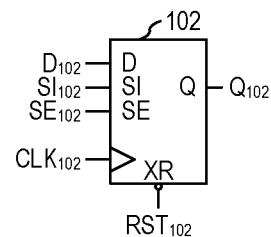
FIG. 1A shows an exemplary scan flip-flop.
Figure 1B:
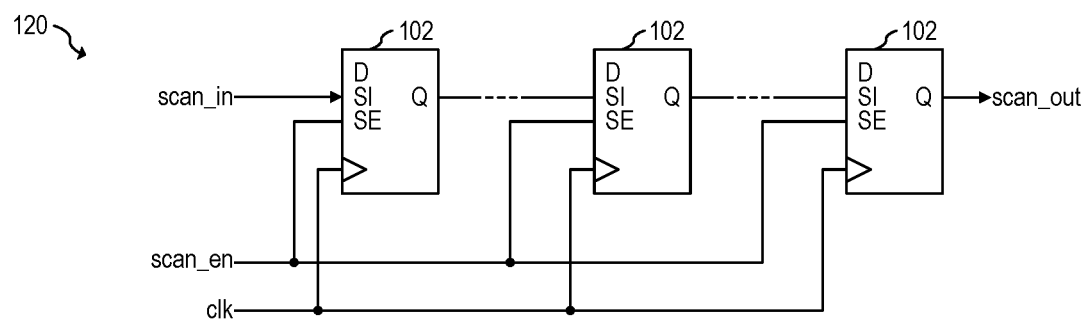
FIG. 1B shows an exemplary scan chain.

In some embodiments, scan chain(s) 514 and 524 may be implemented in any way known in the art, such as shown, e.g., in FIG. 1B. Other signals received by scan chain(s) 514 and 516, such as scan input signal (scan_in) have been omitted for clarify purposes.

In some embodiments, PLL 506 provides in a known manner fast clock signal $CLK_{fast}$. In some embodiments, PLL 506 may be implemented in any way known in the art.

Figure 2:
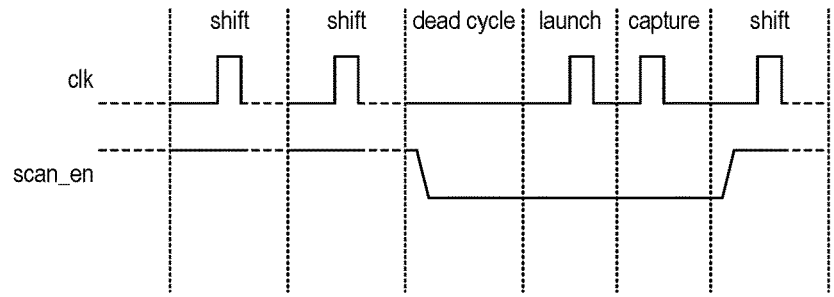
FIGS. 2-4 show exemplary launch-on-capture (LOC), launch-on-shift (LOS), and pipeline LOS waveforms, respectively.

In some embodiments, OCC 512 generates scan clock $CLK_{scan\_hf}$ for use in LOC mode by scan chain(s) 514. For example, with respect to FIG. 2, in some embodiments, the shift pulses of scan clock $CLK_{scan\_hf}$ correspond to pulses of clock $CLK_{slow}$ while the at-speed pulses (launch and capture) correspond to pulses of clock $CLK_{fast}$. By using LOC mode for testing circuit(s) 516 of the high-frequency domain, some embodiments advantageously allow for an easier implementation of the scan circuit (compared with LOS testing) since the scan enable signal scan_en transition may be slow.

As shown in FIG. 5, in some embodiments, OCC 512 receives a test mode signal test_mode. When the test mode signal test_mode is asserted (e.g., high), IC 500 is in scan mode and OCC 512 generates clock $CLK_{scan\_hf}$ for scan testing (e.g., according to LOC mode). When the test mode signal test_mode is deasserted (e.g., low), IC 500 is not in scan mode and OCC 512 generates clock $CLK_{scan\_hf}$ for normal operation (e.g., OCC 512 goes into bypass mode and propagates clock $CLK_{fast}$ into clock $CLK_{scan\_hf}$).

In some embodiments, OCC 512 may be implemented in any way known in the art. For example, in some embodiments, OCC 512 may be implemented using an OCC from a commercial vendor. In some embodiments, OCC 512 may be implemented in a custom manner.

Figure 3:
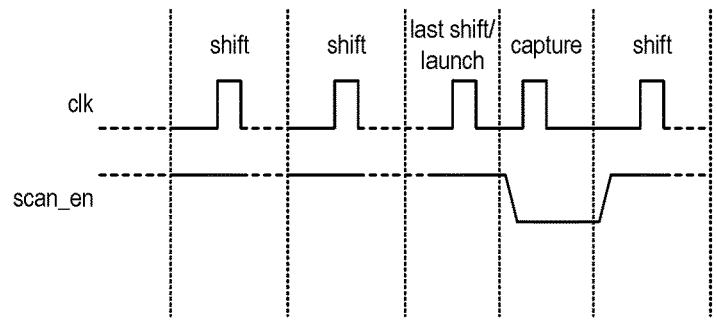

In some embodiments, clock control circuit 522 generates scan clock $CLK_{scan\_lf}$ for use in LOS mode by scan chain(s) 524. For example, with respect to FIG. 3, in some embodiments, the shift pulses of scan clock $CLK_{scan\_lf}$ correspond to pulses of clock $CLK_{slow}$ and the at-speed pulses (last shift/launch and capture) also correspond to pulses of clock $CLK_{slow}$. By using LOS mode for testing circuit(s) 526 of the low-frequency domain, some embodiments advantageously allow for faster test time (compared with LOC testing) since LOS testing may allow for reduced pattern count without sacrificing coverage.

Figure 4:
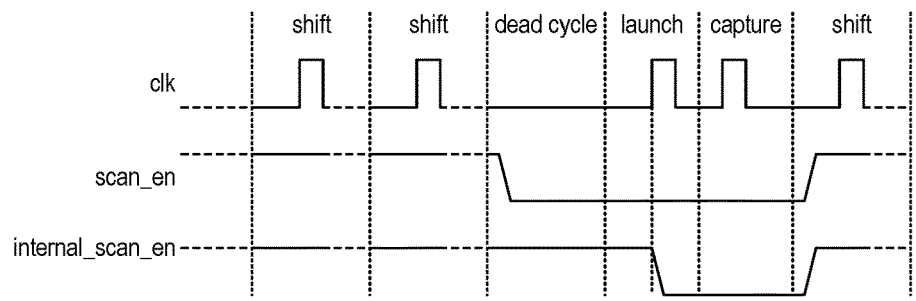

In some embodiments, clock control circuit 522 generates scan clock $CLK_{scan\_lf}$ for use in pipeline LOS mode by scan chain(s) 524. For example, with respect to FIG. 4, in some embodiments, the shift pulses of scan clock $CLK_{scan\_lf}$ correspond to pulses of clock $CLK_{slow}$ and the at-speed pulses (last shift/launch and capture) also correspond to pulses of clock $CLK_{slow}$, gated by internal_scan_en. By using pipeline LOS mode for testing circuit(s) 526 of the low-frequency domain, some embodiments advantageously allow for faster test time (compared with LOC testing) while allowing for easier implementation than LOS testing since timing considerations for scan enable signal scan_en may be relaxed.

As shown in FIG. 5, in some embodiments, clock control circuit 522 receives a test mode signal test_mode. When the test mode signal test_mode is asserted (e.g., high), IC 500 is in scan mode and clock control circuit 522 generates clock $CLK_{scan\_lf}$ for scan testing (e.g., according to LOS mode). When the test mode signal test_mode is deasserted (e.g., low), IC 500 is not in scan mode and clock control circuit 522 generates clock $CLK_{scan\_lf}$ for normal operation (e.g., clock control circuit 522 goes into bypass mode and propagates clock $CLK_{RC}$ into clock $CLK_{scan\_lf}$).

In some embodiments, clock control circuit 522 is implemented with combinatorial logic and flip-flops.

In some embodiments, IC 500 may be, e.g., a microcontroller, power management IC (PMIC), application-specific IC (ASIC), field-programmable gate array (FPGA), etc. In some embodiments, IC 500 may be a different type of IC, such as other types of IC that includes a scan chain.

Figure 6:
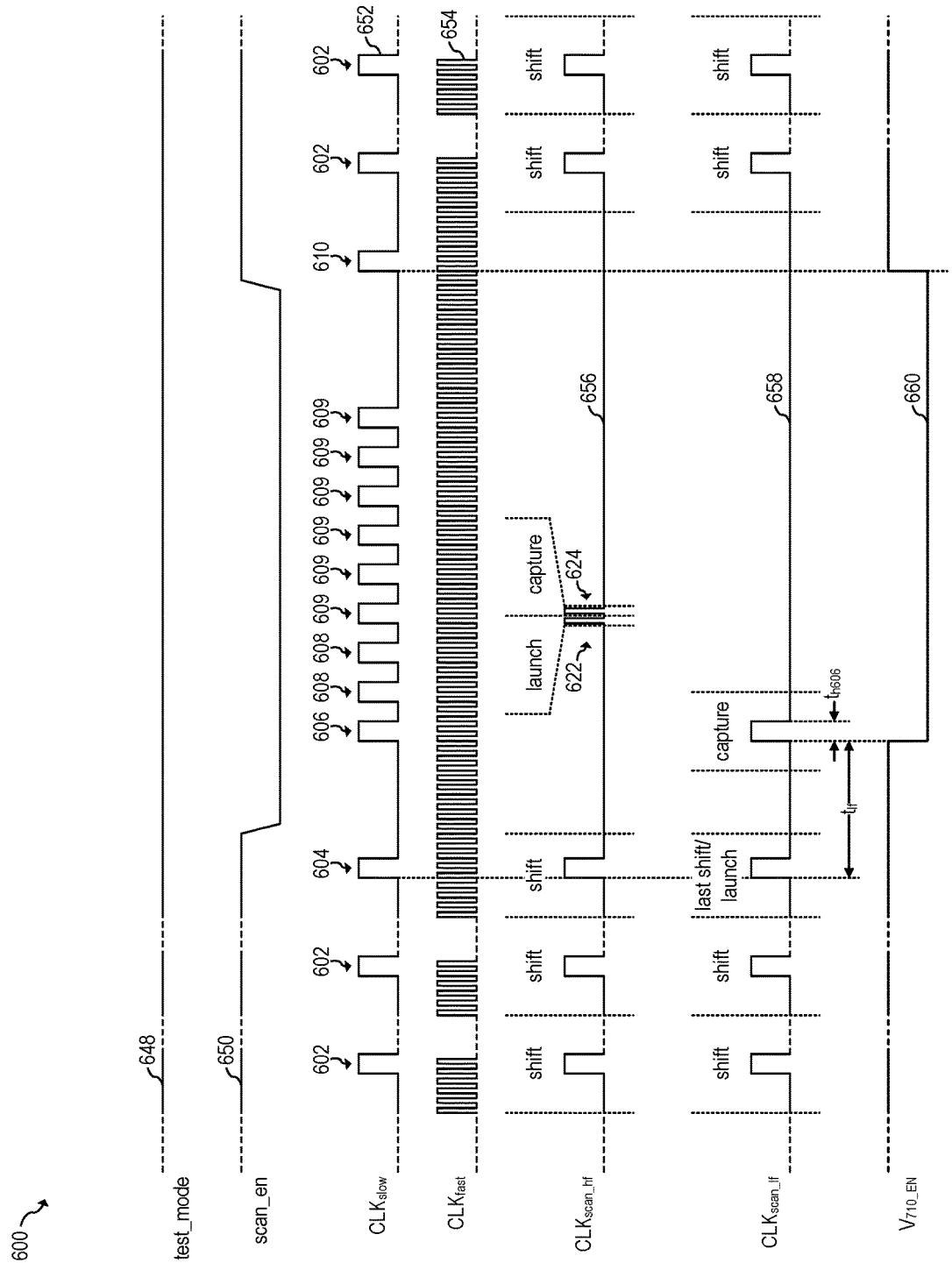
FIG. 6 shows waveforms of the IC of FIG. 5 during scan testing, according to an embodiment of the present invention.

FIG. 6 shows waveforms 600 of IC 500 during scan testing, according to an embodiment of the present invention. Curves 650 and 652 illustrate signals scan_en and $CLK_{slow}$, respectively, from ATE 550. Curve 654 illustrates signal $CLK_{fast}$ from PLL 506. Curve 656 illustrates scan clock $CLK_{scan\_hf}$ from OCC 512. Curve 658 illustrates scan clock $CLK_{scan\_lf}$ from clock control circuit 522. Curve 648 illustrates test mode signal test_mode, which is kept asserted (e.g., high) in FIG. 6, indicating that IC 500 is in scan mode. Curve 660 is present in some embodiments and shows an internal signal of clock control circuit 522 that is indicative of the gating of pulses from clock $CLK_{slow}$ to prevent the propagation of pulses from clock $CLK_{slow}$ to scan clock $CLK_{scan\_lf}$.

Curves 648, 650, 652, 654, 656, 658, and 660 include dashed lines to indicate that portions are not illustrated. For example, curve 652 (and similarly curves 656 and 658) shows dashed lines between pulses 602 and 604 to illustrate that additional pulses 602 may occur. Similarly, curve 654 shows dashed lines to indicate that additional pulses of clock $CLK_{fast}$ occur during the time portions not shown in FIG. 6 (e.g., in some embodiments, clock CLKfast is continuous and does not stop during scan test).

As shown by curve 656, the scan clock $CLK_{scan\_hf}$ generated by OCC 512 corresponds to LOC mode. As shown by curve 656, shift pulses of fast scan clock $CLK_{scan\_hf}$ correspond to pulses 602 and 604 of clock $CLK_{slow}$. The first pulse (606) of the clock $CLK_{slow}$ occurring after the transition of scan enable signal scan_en from high to low causes OCC 512 to begin the process of generation of the launch and capture pulses using clock $CLK_{fast}$. As shown in FIG. 6, pulse 606 is not propagated to scan clock $CLK_{scan\_hf}$.

After a predetermined number of pulses 608 of the clock $CLK_{slow}$, OCC 512 allows a predetermined number of pulses (e.g., 2) from clock $CLK_{fast}$ to propagate to scan clock $CLK_{scan\_hf}$. As illustrated in FIG. 6, in some embodiments, 2 pulses corresponding to launch and capture pulses, respectively, of LOC mode, are propagated from clock $CLK_{fast}$ to scan clock $CLK_{scan\_hf}$. In some embodiments, by causing the frequency of clock $CLK_{fast}$ to match the functional operating frequency of circuit(s) 516, some embodiments are advantageously capable of performing at-speed testing of circuit(s) 516 using scan chain(s) 514. As shown in FIG. 6, none of the pulses 608 and 609 are propagated to scan clock $CLK_{scan\_hf}$.

The first pulse (610) of the clock $CLK_{slow}$ occurring after the transition of scan enable signal scan_en from low to high causes OCC 512 to resume propagating clock $CLK_{slow}$ to scan clock $CLK_{scan\_hf}$. As shown in FIG. 6, pulse 610 is not propagated to scan clock $CLK_{scan\_hf}$.

In some embodiments, pulse 606 is a pulse that is used for configuring OCC 512, does not have a strict timing requirement, and is not propagated to scan clock $CLK_{scan\_hf}$, and may be characterized as a dummy pulse for purposes of scan testing of circuit(s) 516. In some embodiment, pulse 606 may be used as a capture pulse for scan clock $CLK_{scan\_lf}$ operating in LOS mode.

As shown by curve 658, the scan clock $CLK_{scan\_lf}$ generated by clock control circuit 522 corresponds to LOS mode. As shown by curve 658, shift pulses of scan clock $CLK_{scan\_lf}$ correspond to pulses 602 of clock $CLK_{slow}$. The first pulse (606) of the clock $CLK_{slow}$ occurring after the transition of scan enable signal scan_en from high to low is propagated to scan clock $CLK_{scan\_lf}$ and is used as the capture clock. By controlling the time $t_{lf}$ (e.g., by ATE 550) between pulses 604 and 606 of clock $CLK_{slow}$ to match the functional operating frequency of circuit(s) 526, some embodiments are advantageously capable of performing at-speed testing of circuit(s) 526 using scan chain(s) 524 using LOS mode by reusing signals scan_en and $CLK_{slow}$.

As shown in FIG. 6, none of the pulses 608 and 609 are propagated to scan clock $CLK_{scan\_lf}$. The first pulse (610) of the clock $CLK_{slow}$ occurring after the transition of scan enable signal scan_en from low to high causes clock control circuit 522 to resume propagating clock $CLK_{slow}$ to scan clock $CLK_{scan\_lf}$. As shown in FIG. 6, pulse 610 is not propagated to scan clock $CLK_{scan\_lf}$.

In some embodiments, the number of predetermined pulses 608 are between 0 and 10. Other values may also be used.

In some embodiments, the number of pulses 609 are between 0 and 10. Other values may also be used.

In some embodiments, any or all of pulses 602, 604, 606, 608, 609, and 610 may have a duty cycle lower than 50%, such as 20%, 10%, 5% or less. For example, in some embodiments, time $t_{lf}$ between the rising edge of pulses 604 and 606 is 1000 ns while time $t_{h606}$ corresponding of the time in which pulse 606 is high is 20 ns. In some embodiments, any or all of pulses 602, 604, 606, 608, 609, and 610 may have a duty cycle of 50%. For example, in some embodiments, pulses 602 and 604 may have a duty cycle of 50% while pulse 606 may have a duty cycle lower than 10%.

Figure 7:
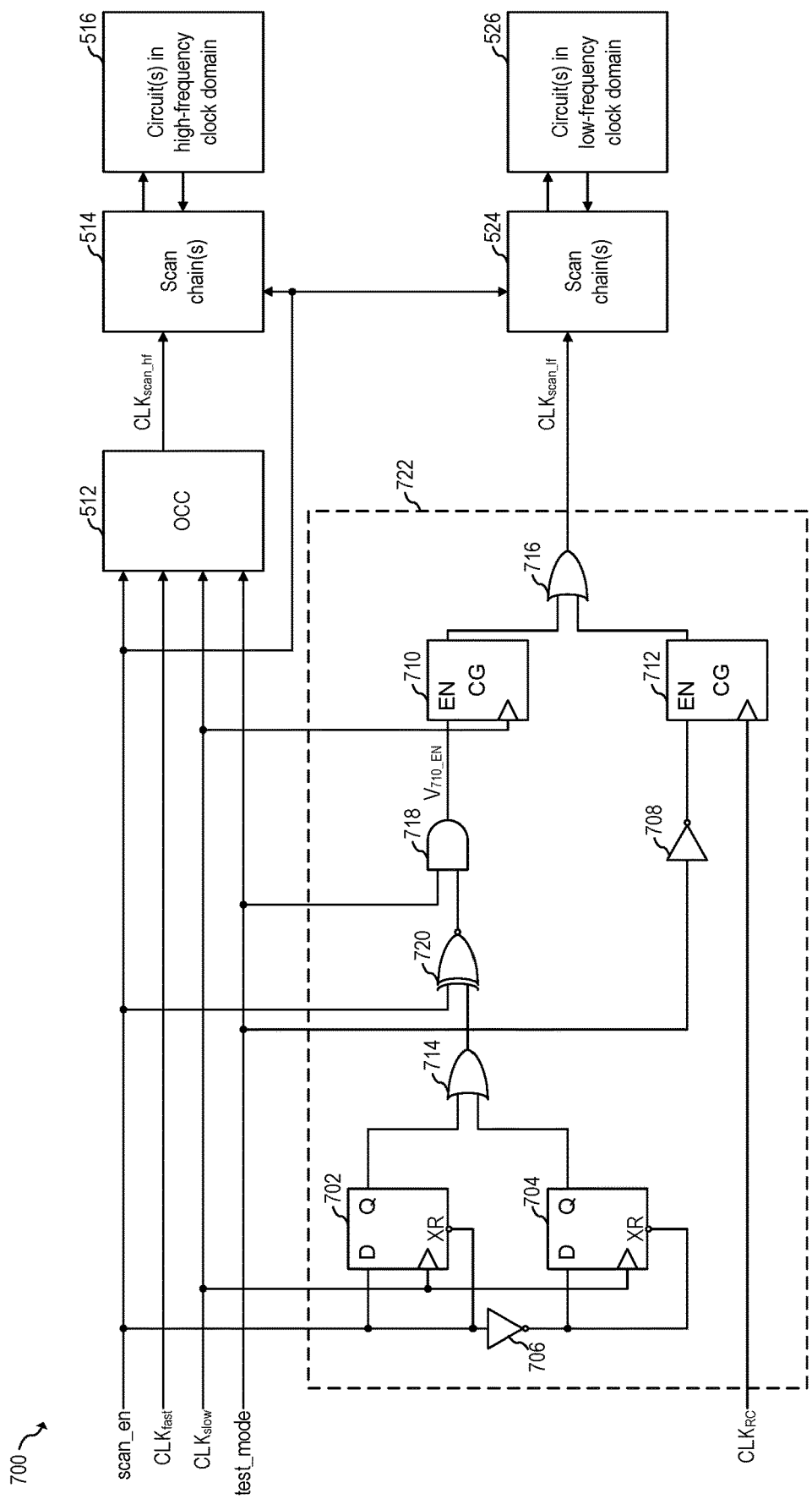
FIG. 7 shows a schematic diagram of an IC illustrating a possible implementation of the clock control circuit of FIG. 5, according to an embodiment of the present invention.

FIG. 7 shows a schematic diagram of IC 700, according to an embodiment of the present invention. IC 700 operates in a similar manner as IC 500 and includes clock control circuit 722, which is a possible implementation of clock control circuit 522. Clock control circuit 722 includes D flip-flops 702 and 704, inverters 706 and 708, clock gating circuits 710 and 712, OR gates 714 and 716, AND gate 718, and XNOR gate 720. In some embodiments, waveforms 600 also apply to IC 700.

As can be seen in FIG. 7, when test mode signal is deasserted (e.g., low), IC 700 is not in scan mode, clock gating circuit 710 is disabled, clock gating circuit 712 is enabled, and internal clock signal $CLK_{RC}$ is propagated via 716 to circuit(s) 526. When test mode signal is asserted (e.g., high), IC 700 is in scan mode, clock gating circuit 712 is disabled, and scan clock $CLK_{scan\_lf}$ is based on the operation of D flip-flops 702 and 704, inverter 706, clock gating circuit 710, OR gate 714, AND gate 718 and XNOR gate 720 and signals scan_en, and $CLK_{slow}$. The operation of IC 700 during scan mode may be understood in view of FIG. 6.

During shift pulses 602 and 604 of clock $CLK_{slow}$, scan enable signal scan_en is high, thereby keeping D flip-flop 704 in reset and keeping the output of D flip-flop 702 high, thereby causing the output of OR gate 714 to be high, thereby causing the output of XNOR gate 720 to be high, thereby causing clock gating circuit 710 to be enabled, thereby causing clock $CLK_{slow}$ to propagate to scan clock signal $CLK_{scan\_lf}$ as illustrated by curve 658.

After the transition of scan enable signal scan_en from high to low and before pulse 606, D flip-flop 702 is placed in reset, and D flip-flop 704 is taken out of reset. Since D flip-flop 704 comes out of reset at a default state of low, the output of D flip-flop 704 is low, which causes the output of OR gate 714 to be low. Since scan enable signal scan_en is also low, the output of XNOR gate 720 is high, thereby causing the output of AND gate 718 to remain high, keeping enabled clock gating circuit 710.

Since clock gating circuit 710 is enabled when pulse 606 of clock $CLK_{slow}$ occurs, pulse 606 is propagated to scan clock $CLK_{scan\_lf}$ as illustrated by curve 658. Pulse 606 of slow clock $CLK_{slow}$, however, causes D flip-flop 704 to transition from low to high, which causes the output of OR gate 714 to be high, which causes the output of XNOR gate 720 to be low, which causes the output of AND gate 718 to be low, which disables clock gating circuit 710. Since clock gating circuit 710 is disabled after pulse 606, pulses 608 and 609 are not propagated to scan clock $CLK_{scan\_lf}$ as illustrated by curve 658.

After the transition of scan enable signal scan_en from low to high and before pulse 610, D flip-flop 704 is placed in reset, and D flip-flop 702 is taken out of reset. Since D flip-flop 702 comes out of reset at a default state of low, the output of D flip-flop 702 is low, which causes the output of OR gate 714 to be low. Since scan enable signal scan_en is high, the output of XNOR gate 720 is low, thereby causing the output of AND gate 718 to remain low, keeping disabled clock gating circuit 710. Since clock gating circuit 710 is disabled during pulse 610, pulse 610 is not propagated to scan clock $CLK_{scan\_lf}$ as illustrated by curve 658. Pulse 610 of slow clock $CLK_{slow}$, however, causes D flip-flop 702 to transition from low to high, which causes the output of OR gate 714 to be high, which causes the output of XNOR gate 720 to be high, which causes the output of AND gate 718 to be high, which enables clock gating circuit 710. Since clock gating circuit 710 is enabled after pulse 610, shift pulses 602 are propagated to scan clock $CLK_{scan\_lf}$ as illustrated by curve 658.

Figure 8A:
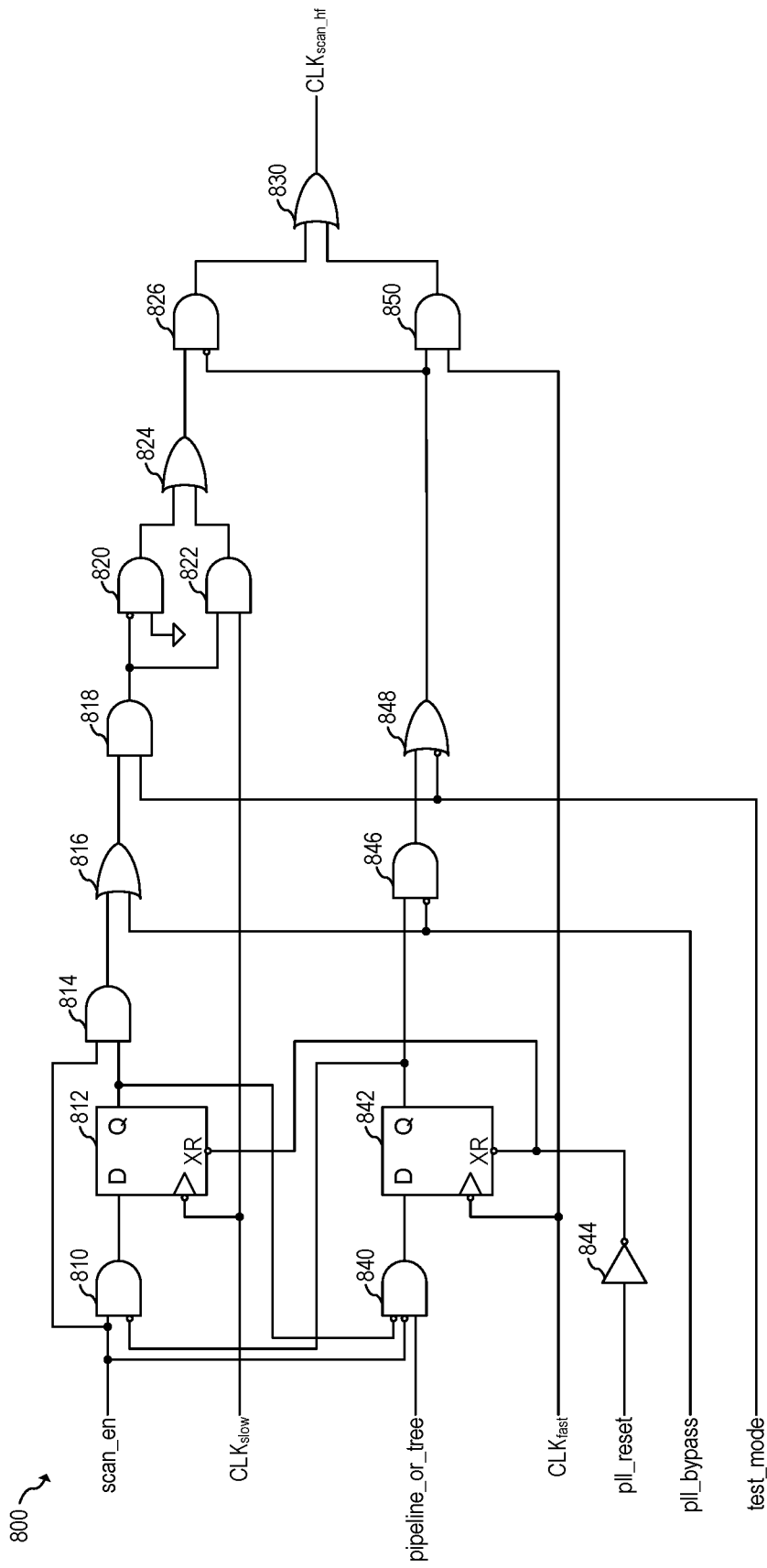
FIGS. 8A and 8B show schematic diagrams of possible implementations of the OCC of FIG. 5, according to embodiments of the present invention.

FIG. 8A shows a schematic diagram of OCC 800, according to an embodiment of the present invention. OCC 512 may be implemented as OCC 800. In some embodiments, waveforms 600 also apply to IC 500 or 700 when OCC 512 is implemented as OCC 800.

As can be seen in FIG. 8A, when test mode signal is deasserted (e.g., low), OCC 800 is not in scan mode, the output of OR gate 848 is high, which causes the output of AND gate 826 to be low and causes clock $CLK_{fast}$ to be propagated to scan clock $CLK_{scan\_hf}$. When test mode signal is asserted (e.g., high), and signals pll_bypass and pll_reset are deasserted (e.g., low), OCC 800 is in scan mode, AND gates 818 and 846, and OR gates 816 and 848 operate as buffers, and scan clock $CLK_{scan\_hf}$ is based on the operation of D flip-flops 812 and 842, AND gates 810, 814, 820, 822, 826, 840 and 850, and OR gates 824, and 830, and signals scan_en, pipeline_or_tree, $CLK_{slow}$ and $CLK_{fast}$. The operation of OCC 800 during scan mode may be understood in view of FIG. 6.

When scan enable signal scan_en is high, AND gate 840 outputs low, which causes D flip-flop 842 to output low, which causes AND gate 850 to output low, thereby causing scan clock $CLK_{scan\_hf}$ to follow the output of AND gate 826. Since the output of D flip-flop 842 is low when scan enable signal scan_en is high, the output of AND gate 810 is high, which causes the output D flip-flop 812 to be high, which causes the output of AND gate 814 to be high, which causes the output of AND gate 822 to follow clock $CLK_{slow}$ while the output of AND gate 820 is low, which causes the output of OR gate 824 to follow clock $CLK_{slow}$, which causes the output of AND gate 826 to follow clock $CLK_{slow}$, which causes scan clock $CLK_{scan\_hf}$ to follow clock $CLK_{slow}$, as shown by curve 656.

When scan enable signal scan_en transitions from high to low, the output of AND gate 814 becomes low, which causes the output of AND gate 818 to transition low. AND gate 820 remains low as one of its inputs is tied low, which causes the output of OR gate 824 to remain low. Since AND gate 850 receives at one input clock $CLK_{fast}$, AND gate 850 operates as a gating circuit based on the output of OR gate 848. Since the output of D flip-flop 812 is low when scan enable signal scan_en is low, the output of D flip-flop 842, and thus the output of OR gate 848 is based on signal pipeline_or_tree, which may be selectively switched to allow, e.g., 2 pulses (e.g., 622 and 624) to propagate to scan clock $CLK_{scan\_hf}$, and without propagating any of pulses 606 and 609 of clock $CLK_{slow}$, as illustrated by curve 656.

When scan enable signal scan_en transitions from low to high, AND gate 850 outputs low, thereby causing scan clock $CLK_{scan\_hf}$ to follow the output of AND gate 826. Before pulse 610 of clock $CLK_{slow}$, the output of D flip-flop 812 remains low. Pulse 610 of clock $CLK_{slow}$ causes D flip-flop 812 to transition from low to high, but pulse 610 is not propagated to scan clock $CLK_{scan\_hf}$, as illustrated by curve 656.

Figure 8B:
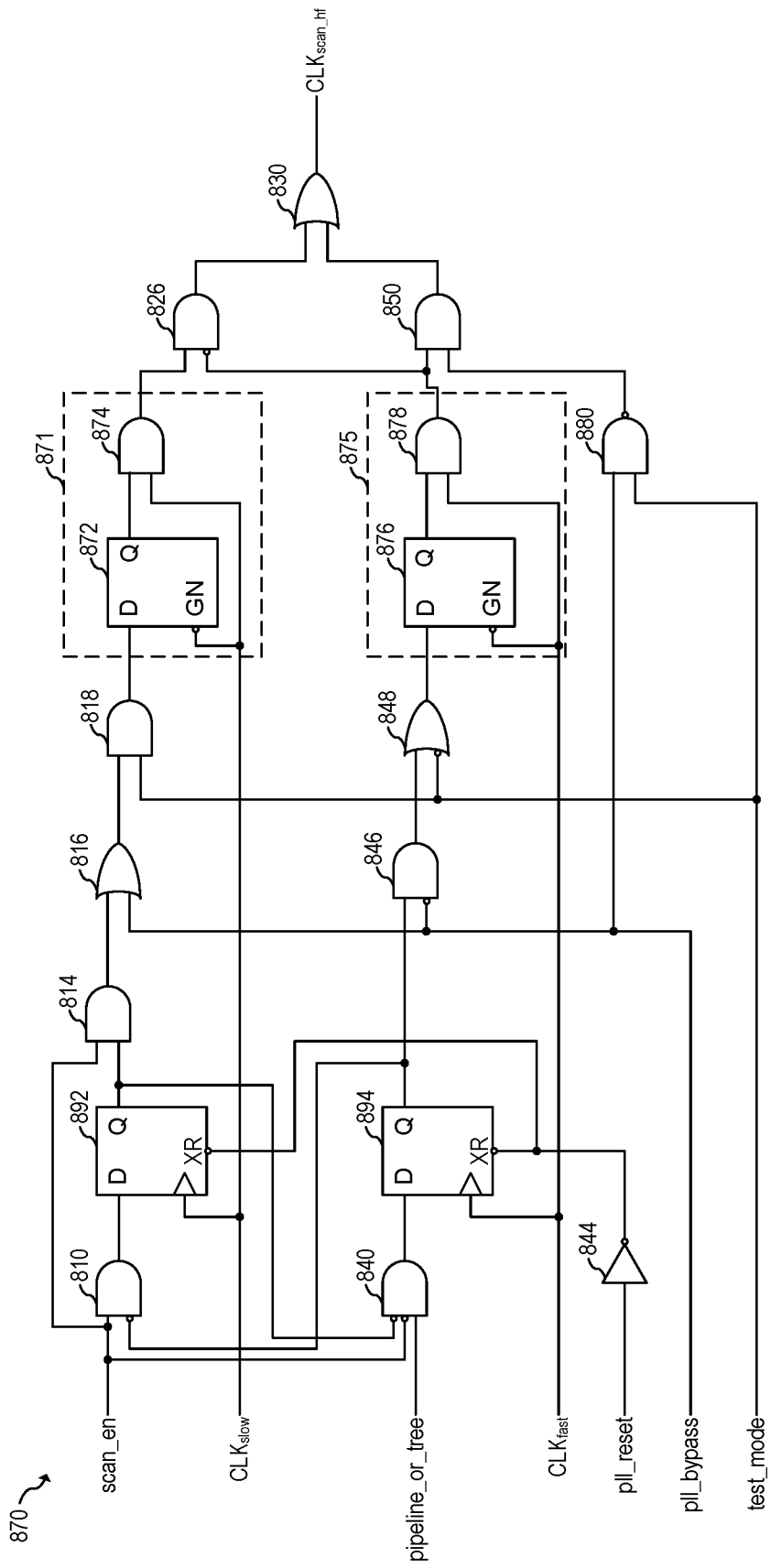

FIG. 8B shows a schematic diagram of OCC 870, according to an embodiment of the present invention. OCC 512 may be implemented as OCC 870. In some embodiments, waveforms 600 also apply to IC 500 or 700 when OCC 512 is implemented as OCC 870.

OCC 870 operates in a similar manner as OCC 800. OCC 870, however, uses clock gating circuits 871 and 875 in the clock path instead of using AND/OR gates 820, 822, 824 and uses positive-edge triggered flip-flops 892 and 894 instead of negative-edge triggered flip-flops 812 and 842.

Figure 9:
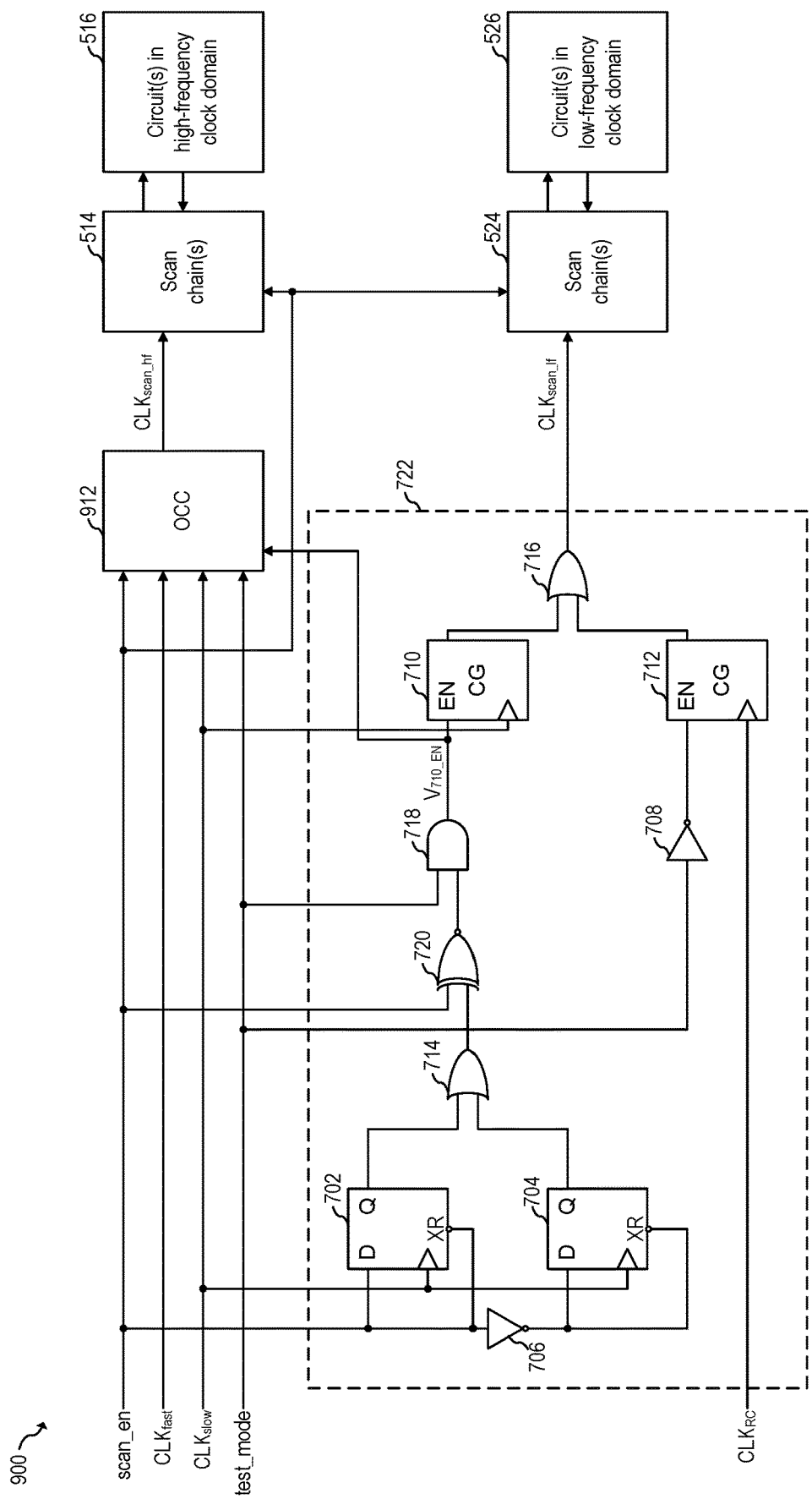
FIGS. 9-11 show schematic diagrams of ICs, according to embodiments of the present invention.

As shown in FIGS. 8A and 8B, in some embodiments, the OCC transitions between propagating the clock $CLK_{slow}$ to scan clock $CLK_{scan\_hf}$ to propagating at-speed pulses from clock $CLK_{fast}$ to scan clock $CLK_{scan\_hf}$ using internal circuits of the OCC. In some embodiments, the OCC transitions between propagating the clock $CLK_{slow}$ to propagating at-speed pulses from clock $CLK_{fast}$ using a signal external to the OCC. For example, FIG. 9 shows a schematic diagram of IC 900, according to an embodiment of the present invention. IC 900 operates in a similar manner as IC 700. IC 900, however, includes OCC 912. OCC 912 operates in a similar manner as OCC 512. OCC 912, however, uses signal $V_{710\_EN}$ to control the transition between propagating the clock $CLK_{slow}$ to scan clock $CLK_{scan\_hf}$ to propagating at-speed pulses from clock $CLK_{fast}$ to scan clock $CLK_{scan\_hf}$. In some embodiments, waveforms 600 apply to IC 900.

Figure 10:
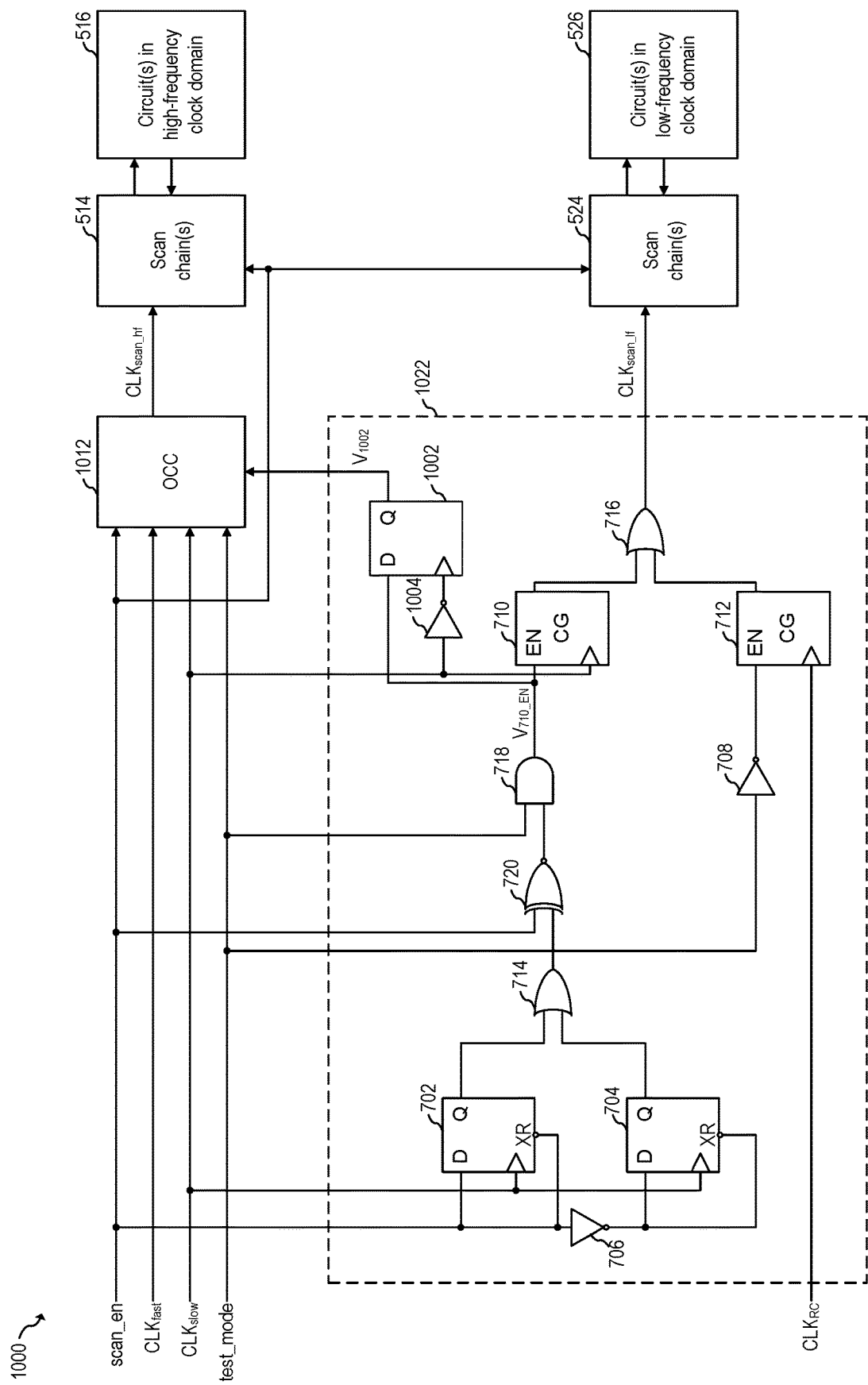

As shown in FIGS. 6 and 9, an OCC (e.g., 912) may use an external to trigger the transition between propagating the clock $CLK_{slow}$ to scan clock $CLK_{scan\_hf}$ to propagating at-speed pulses from clock $CLK_{fast}$ to scan clock $CLK_{scan\_hf}$, where the external signal (e.g., V710_EN) transitions at the rising edge of the clock $CLK_{slow}$. In some embodiments, the external signal used by an OCC to control the transition between propagating the clock $CLK_{slow}$ to scan clock $CLK_{scan\_hf}$ to propagating at-speed pulses from clock $CLK_{fast}$ to scan clock $CLK_{scan\_hf}$ transitions at the falling edge of clock $CLK_{slow}$. For example, FIG. 10 shows a schematic diagram of IC 1000, according to an embodiment of the present invention. IC 100 operates in a similar manner as IC 900. IC 1000, however, includes OCC 1012 and clock control circuit 1022.

In some embodiments, OCC 1012 operates in a similar manner as OCC 912. OCC 1012, however, uses signal $V_{1002}$ to control the transition between propagating the clock $CLK_{slow}$ to scan clock $CLK_{scan\_hf}$ to propagating at-speed pulses from clock $CLK_{fast}$ to scan clock $CLK_{scan\_hf}$ instead of using signal $V_{710\_EN}$. In some embodiments, signal $V_{1002}$ is similar to signal $V_{710\_EN}$, except that signal $V_{1002}$ transitions at the falling edge of clock $CLK_{slow}$ (e.g., at the falling edge of pulses 606 and 610) instead of at the rising edge of clock $CLK_{slow}$.

In some embodiments, clock control circuit 1022 operates in a similar manner as clock control circuit 722. Clock control circuit 1022 includes D flip-flop 1002 and inverter 1004 for generating signal $V_{1002}$.

Figure 11:
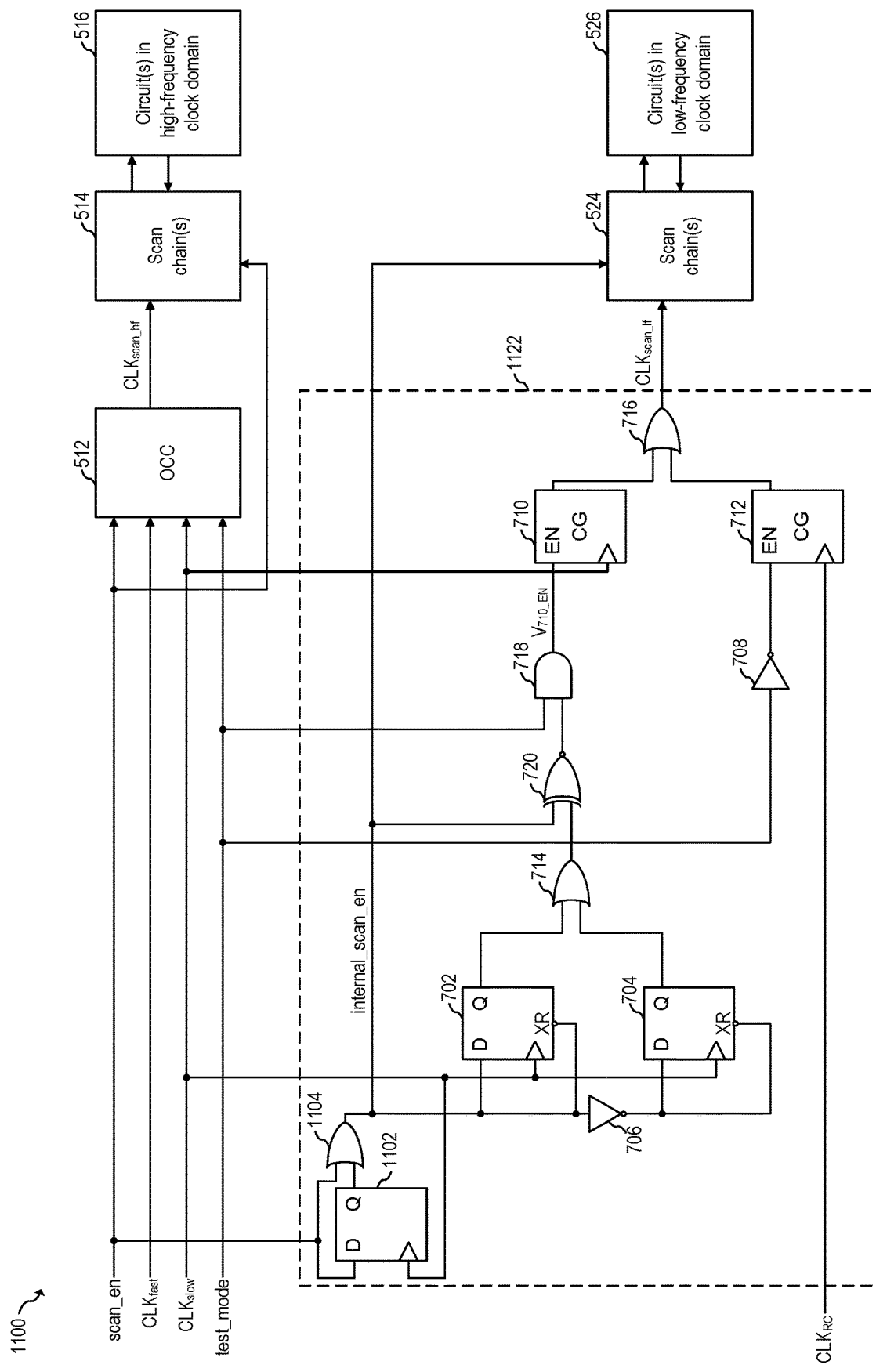

FIG. 11 shows a schematic diagram of IC 1100, according to an embodiment of the present invention. IC 1100 operates in a similar manner as IC 700 and clock control circuit 1122 operates in a similar manner as clock control circuit 722, where clock control circuit 1122 is a possible implemented of clock control circuit 522. IC 1100, however, performs scan testing of circuit(s) 526 using by operating scan chain(s) 524 using pipeline LOS.

For example, clock control circuit 1122 operates in a similar manner as clock control circuit 722. Clock control circuit 1122, however, drives the D input of D flip-flop 702, the input of inverter 706, and the scan enable of scan chain(s) 524 with internal scan enable signal internal_scan_en instead of driving the D input of D flip-flop 702, the input of inverter 706, and the scan enable of scan chain(s) 524 with scan enable signal scan_en.

As shown in FIG. 11, clock control circuit 1122 includes positive edge triggered flip flop 1102 and OR gate 1104 for generating internal scan enable signal internal_scan_en for pipeline LOS mode based on scan enable signal scan_en and clock $CLK_{slow}$.

When scan enable signal scan_en is high, internal scan enable signal internal_scan_en is identical to scan enable signal scan_en. When scan enable signal scan_en transitions from high to low, internal scan enable signal internal_scan_en remains high until the first pulse of clock $CLK_{slow}$.

Figure 12:
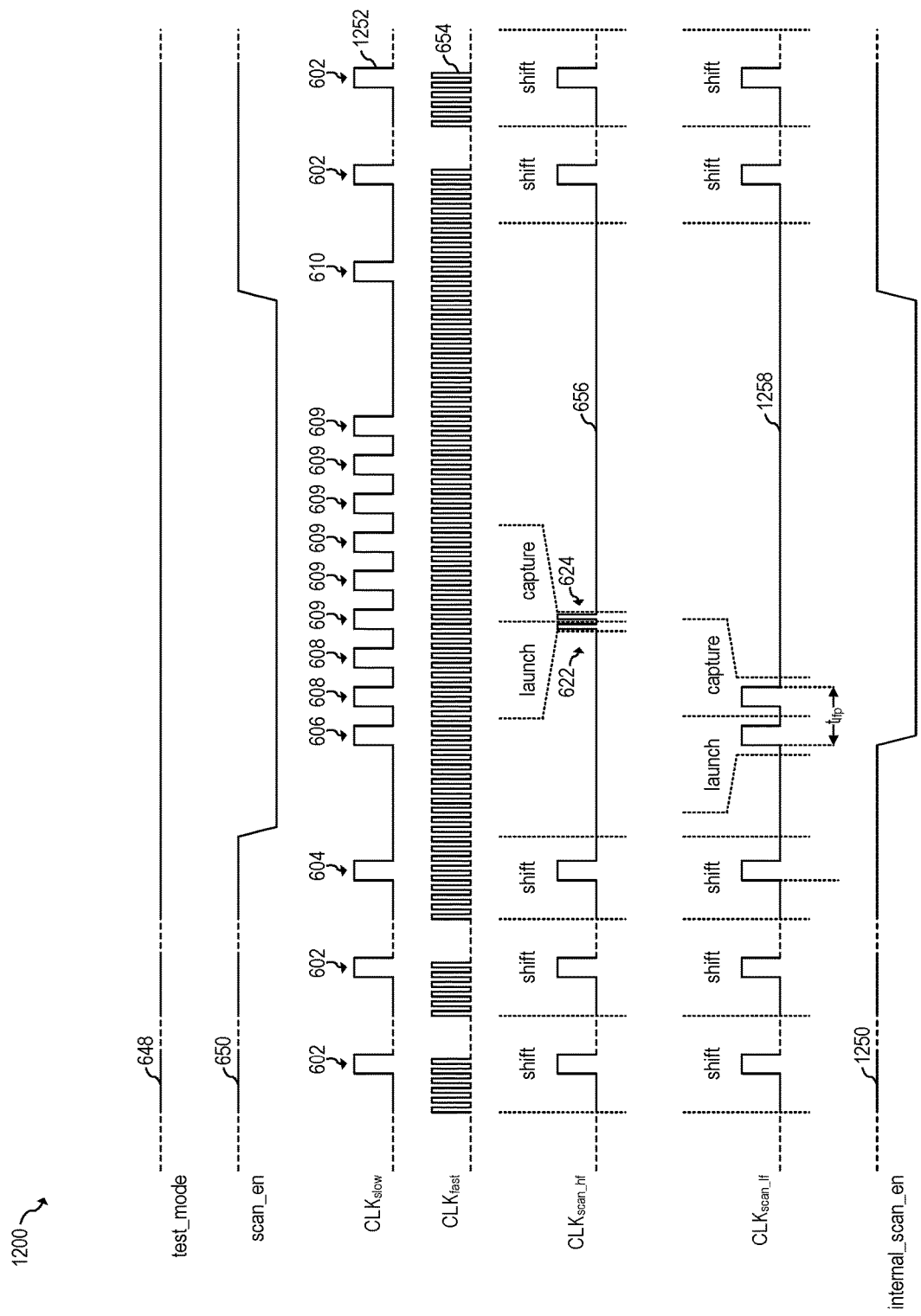
FIG. 12 shows waveforms of the IC of FIG. 11 during scan testing, according to an embodiment of the present invention.

FIG. 12 shows waveforms 1200 of IC 1100 during scan testing, according to an embodiment of the present invention. Curves 648, 650, and 656 are the same as in FIG. 6. In some embodiments, curve 1252 may be identical to curve 652. Curve 1258 illustrates scan clock $CLK_{scan\_hf}$ from clock control circuit 1122 in pipeline LOS mode. Curve 1250 illustrates internal scan enable signal internal_scan_en. Similarly to curves 648, 650, 654, and 656, curves 1250, 1252, and 1258 include dashed lines to indicate that portions are not illustrated.

As shown in FIG. 12, internal scan enable signal internal_scan_en remains high for a longer time than scan enable signal scan_en. During pulse 606, internal scan enable signal internal_scan_en transitions from high to low, and pulses 606 and the first pulse 608 become the launch and capture pulses in the pipeline LOS mode, with the rest of pulses 608 and 609 being gating in a similar manner as described with respect to FIG. 6. By controlling time $t_{lfp}$ (e.g., using ATE 550), some embodiments may perform at-speed scan testing using IC 1000.

In some embodiments, pulse 606 and the first pulse 608 have 50% duty cycle. By using 50% duty cycles for pulses 606 and the first pulse 608, some embodiments are advantageously capable of using pipeline LOS mode in scan chains/circuits having, e.g., the launch event triggered by the positive edge of clock $CLK_{slow}$, and the capture event triggered by the negative edge of clock $CLK_{slow}$, and vice versa, without overdesigning the clock path to meet timing constraints (with the duration of the pulses matching the functional operation frequency of circuit(s) 526). In some embodiments, the duty cycle of pulses 602, 604, 606, 608 and 609 is 50% while the frequency of pulses 606, 608 and 609 is lower than the frequency of pulses 602 and 604.

In some embodiments, IC 1100 may be implemented with OCC 912 (e.g., with clock control circuit 1122 providing signal $V_{710\_EN}$ to OCC 912. In some embodiments, IC 1100 may be implemented with OCC 1012, with clock control circuit 1122 generating signal $V_{1002}$ in a similar manner as clock control circuit 1022 (e.g., by including D flip-flop 1002 and inverter 1004 connected, e.g., as shown in FIG. 10).

In some embodiments, it may be sufficient to check one or more circuit paths (e.g., non-functional paths) using stuck-at mode (using scan testing to check for stuck-at faults) without checking such circuit path in at-speed mode (using scan testing to check transition faults). Since stuck-at faults are frequency independent, a stuck-at mode scan pass to test the circuit(s) 516 of the high-frequency domain is performed in parallel with an at-speed mode scan pass of circuit(s) 526 of the low-frequency domain. By performing at least some stuck-at fault checks of the circuit(s) 516 during the at-speed mode scan, some embodiments advantageously reduce the pattern count of a subsequent stuck-at mode scan of the circuit(s) 516 without sacrificing stuck-at coverage.

Figure 13:
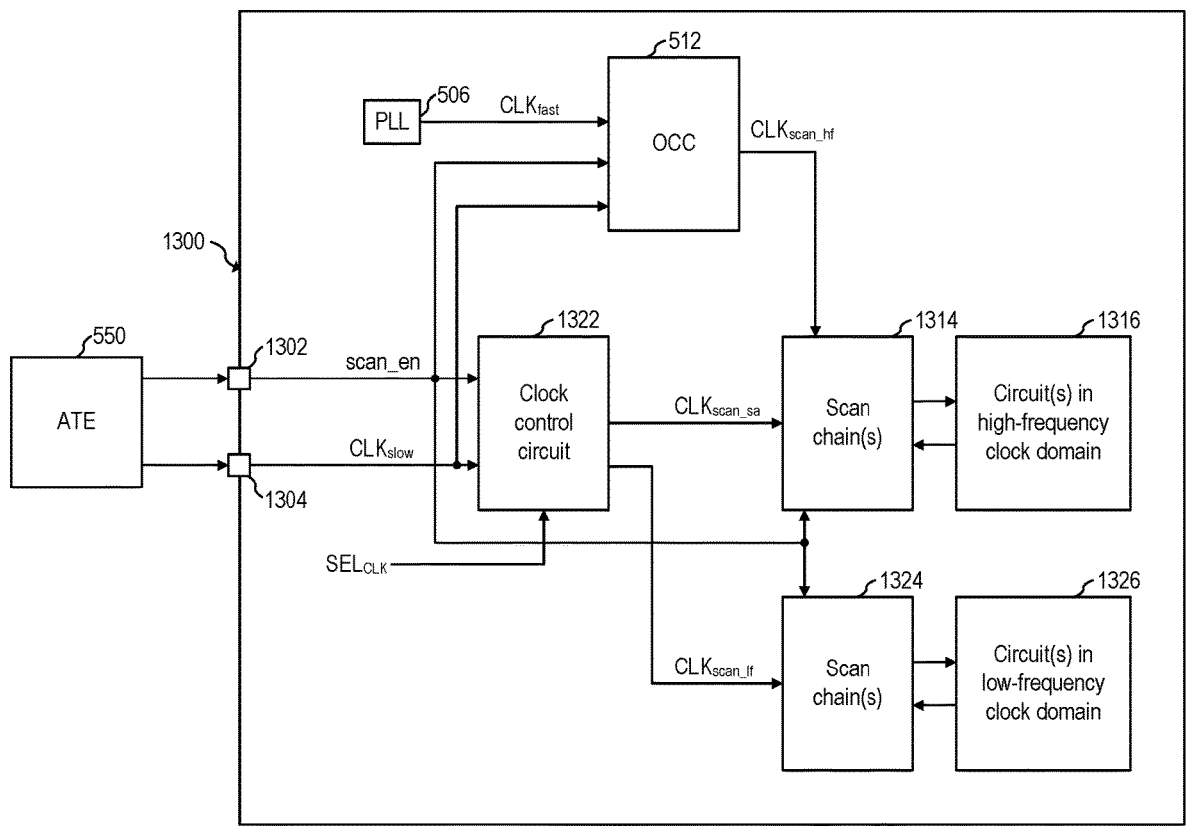
FIG. 13 shows a schematic diagram of an IC, according to an embodiment of the present invention.

FIG. 13 shows a schematic diagram of IC 1300, according to an embodiment of the present invention. IC 1300 operates in a similar manner as IC 500. IC 1300, however, includes clock control circuit 1322. Clock control circuit 1322 generates scan clock $CLK_{scan\_sa}$ for testing stuck-at faults in circuit(s) 1316 of a high-frequency domain and scan clock $CLK_{scan\_lf}$ for testing transition faults (using at-speed mode) of circuit(s) 1326 of a low-frequency domain.

Figure 14:
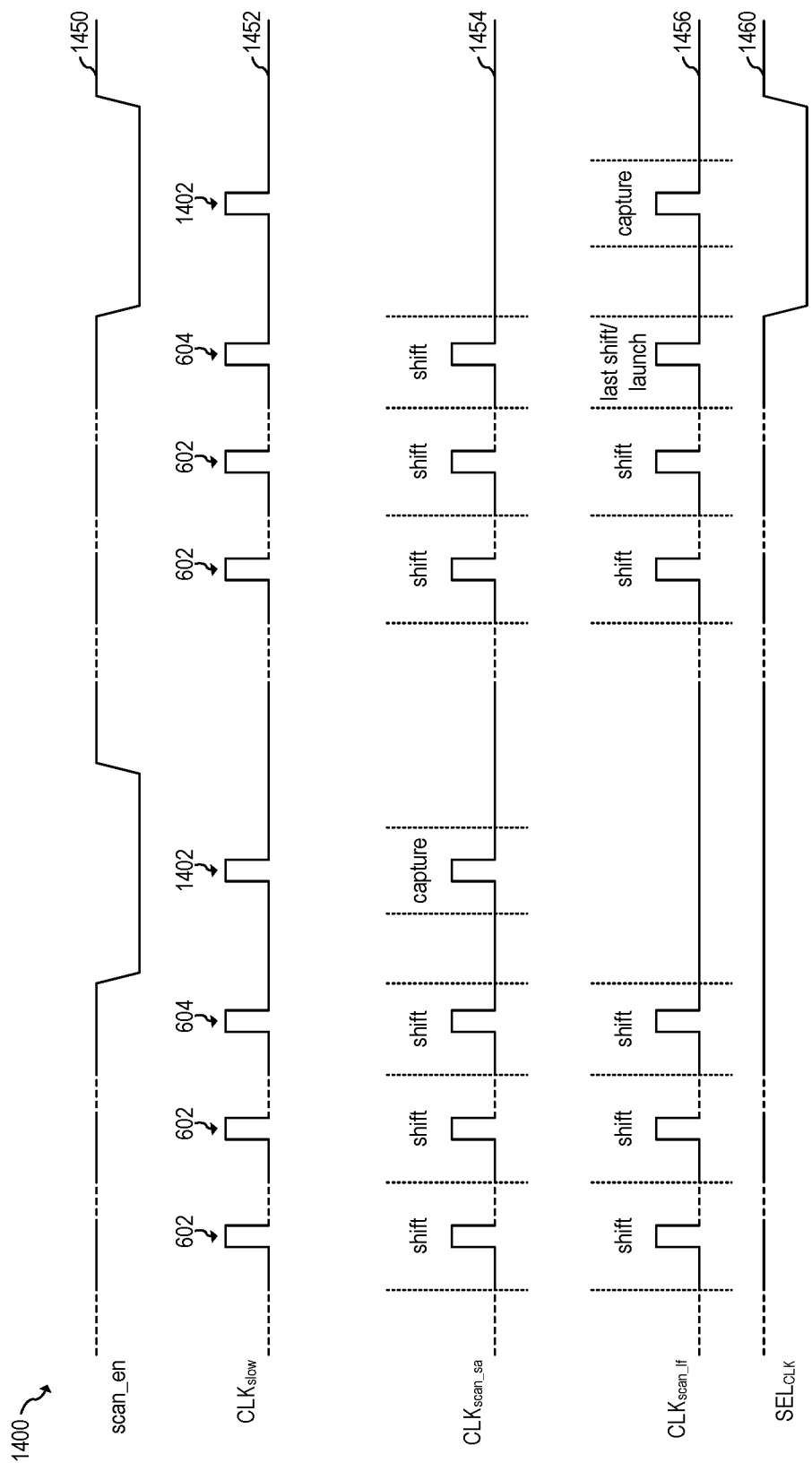
FIG. 14 shows waveforms of the IC of FIG. 13 during scan testing, according to an embodiment of the present invention.

FIG. 14 shows waveforms 1400 of IC 1300 during scan testing, according to an embodiment of the present invention. Curves 1450 and 1452 illustrate signals scan_en and $CLK_{slow}$, respectively, from ATE 550. Curve 1454 illustrates signal CLKscan_sa for checking for stuck-at faults in circuit(s) 1316. Curve 1456 illustrates scan clock $CLK_{scan\_lf}$ for testing transition faults in circuit(s) 1326. Curves 1450, 1452, 1454, 1456, and 1460, include dashed lines to indicate that portions are not illustrated.

FIGS. 13 and 14 may be understood together.

As shown by curve 1456, in some embodiments, circuit(s) 1326 are tested using LOS mode.

As shown in FIG. 14, shift pulses 602 and 604 are propagated to both signals $CLK_{scan\_sa}$ and $CLK_{scan\_lf}$. The capture pulses 1402 are propagated to only one of signals $CLK_{scan\_sa}$ and $CLK_{scan\_lf}$ (e.g., based on the state of signal $SEL_{CLK}$). For example, as shown in FIG. 14, in some embodiments, when signal $SEL_{CLK}$ is high, capture pulse 1402 is propagated to scan clock $CLK_{scan\_sa}$ for checking stuck-at faults in circuit(s) of the high-frequency domain. When signal $SEL_{CLK}$ is low, capture pulse 1402 is propagated to scan clock $CLK_{scan\_lf}$ for at-speed scan testing of circuits of the low-frequency domain.

As shown in FIG. 14, in some embodiments, the same clock ($CLK_{slow}$), e.g., from ATE 550, may be advantageously used to perform, in parallel, at-speed scan testing of a low-frequency domain and stuck-at scan testing of a high-frequency domain (e.g., since the low-frequency used for at-speed testing of the low-frequency domain is relatively low to be used for checking stuck-at faults in a high-frequency domain).

In some embodiments, clock control circuit 1322 may be implemented with combinatorial logic and flip-flops.

In some embodiments, signal $SEL_{CLK}$ is generated by ATE 550 and propagated to clock control circuit 1322 via a pin or pad (not shown) of IC 1300. In some embodiments, signal $SEL_{CLK}$ may be generated inside IC 1300. For example, in some embodiments, signal $SEL_{CLK}$ may be generated using a scan flip-flop (e.g., 102), e.g., acting as a one hot decoder. Other implementations are also possible.

In some embodiments, IC 1300 and IC 500 are part of the same IC, where pins or pads 502 and 1302 are the same pin or pad, where pins or pads 504 and 1304 are the same pin or pad, where circuit(s) 1316 are the same as circuit(s) 516 or additional to circuit(s) 516, where circuit(s) 1326 are the same as circuit(s) 526 or additional to circuit(s) 526, where scan chain(s) 1314 are the same as scan chain(s) 514 or additional to scan chain(s) 514, and where scan chain(s) 1324 are the same as scan chain(s) 524 or additional to scan chain(s) 524.

Figure 15:
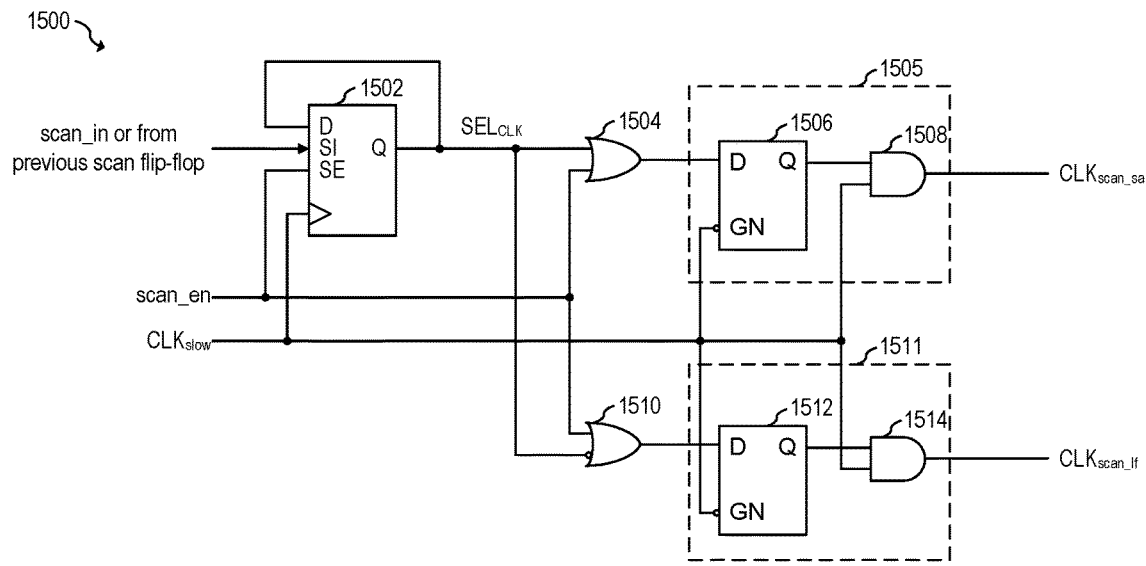
FIG. 15 shows a schematic diagram of the clock control circuit of FIG. 13, according to an embodiment of the present invention.

FIG. 15 shows a schematic diagram of clock control circuit 1500, according to an embodiment of the present invention. Clock control circuit 1500 includes scan flip-flop 1502, OR gates 1504 and 1510, and clock gating circuits 1505 and 1511. Clock control circuit 1322 may be implemented as clock control circuit 1500. FIG. 15 may be understood in view of FIG. 14.

As can be seen in FIG. 15, when scan enable signal scan_en is high, the outputs of each of OR gates 1504 and 1510 is also high, which causes the output of each of D latches 1506, and 1512 to be high, which causes clock signal $CLK_{slow}$ to propagate to both clock signals $CLK_{scan\_sa}$ and $CLK_{scan\_lf}$ (as illustrated by curves 1450, 1452, 1454, and 1456).

When scan enable signal transitions from high to low, the output of D flip-flop 1502 (producing signal $SEL_{CLK}$) depends on the last shift value from the input of scan flip-flop 1502 before transition of scan enable signal from high to low. When signal $SEL_{CLK}$ is high after the transition of the scan enable signal scan_en from high to low, the output of OR gate 1504 is high while the output of OR gate 1510 is low, which causes the pulse from clock signal $CLK_{slow}$ to propagate to clock signal $CLK_{scan\_sa}$ and not to clock signal $CLK_{scan\_lf}$, as illustrated by curves 1450, 1452, 1454, 1456, and 1460. When signal $SEL_{CLK}$ is low after the transition of the scan enable signal scan_en from high to low, the output of OR gate 1510 is high while the output of OR gate 1504 is low, which causes the pulse from clock signal $CLK_{slow}$ to propagate to clock signal $CLK_{scan\_lf}$ and not to clock signal $CLK_{scan\_sa}$, as illustrated by curves 1450, 1452, 1454, 1456, and 1460.

As shown in FIG. 15, in some embodiments, scan flip-flop 1502 is part clock control circuit 1500, and receives its scan input SI directly from scan input signal scan_in or from another scan flip-flop in a scan chain. In some embodiments, scan flip-flop 1502 is external to clock control circuit 1500 and, e.g., is part of a scan chain (e.g., different from scan chain(s) 1314 and 1324).

Figure 16:
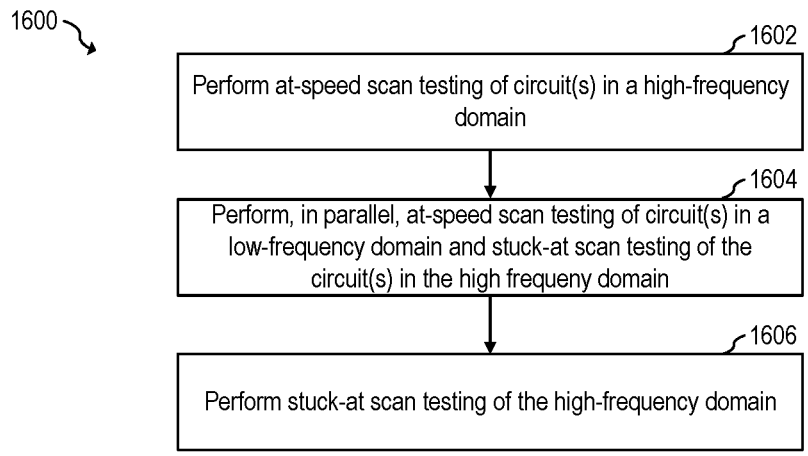
FIGS. 16 and 17 show flow charts of embodiment methods for scan testing an IC, according to embodiments of the present invention.

FIG. 16 shows a flow chart of embodiment method 1600 for scan testing an IC, according to an embodiment of the present invention. Method 1600 may be performed to test IC 500, 700, 900, 1000, 1100, or 1300.

During step 1602, at-speed scan testing of circuit(s) in a high-frequency domain (e.g., 516, 1316) is performed, e.g., using LOC mode. In some embodiments, the at-speed scan testing of the circuit(s) in the high-frequency domain is performed by using an OCC (e.g., 512, 912).

During step 1604, at-speed scan testing of circuit(s) in a low-frequency domain (e.g., 526, 1326) is performed, e.g., using LOS mode, while performing, in parallel, stuck-at scan testing of the circuit(s) in the high-frequency domain. In some embodiments, step 1504 is performed in a similar manner as described with respect to FIGS. 13 and 14.

During step 1606, stuck-at scan testing of the circuit(s) in the high-frequency domain is performed. In some embodiments, since some stuck-at scan testing has already been performed during step 1604, the stuck-at scan testing performed during step 1606 advantageously has a reduced scan pattern count.

Figure 17:
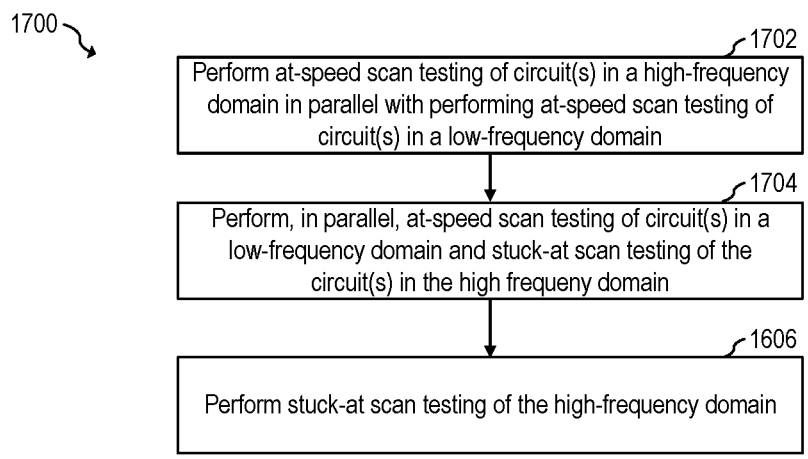

FIG. 17 shows a flow chart of embodiment method 1700 for scan testing an IC, according to an embodiment of the present invention. Method 1700 may be performed to test IC 500, 700, 900, 1000, 1100, or 1300.

During step 1702, at-speed scan testing of circuit(s) in a high-frequency domain (e.g., 516, 1316) is performed, e.g., using LOC mode, in parallel with at-speed scan testing of circuit(s) in a low-frequency domain (e.g., 526, 1326), e.g., using LOS mode or pipeline LOS mode. In some embodiments, the at-speed scan testing performed during step 1702 is performed according to an embodiment described with respect to FIGS. 5, 6, 7, 8, 9, 10, 11, and 12.

During step 1704, at-speed scan testing of circuit(s) in a low-frequency domain (e.g., 526, 1326) is performed, e.g., using LOS mode, while performing, in parallel, stuck-at scan testing of the circuit(s) in the high-frequency domain. In some embodiments, step 1704 is performed in a similar manner as described with respect to FIGS. 13 and 14, and checks any additional at-speed coverage of the circuit(s) of the low-frequency domain not tested during step 1702.

Step 1606 may be performed in a similar manner as described with respect to FIG. 16, and checks any additional stuck-at coverage of the circuit(s) of the high-frequency domain not tested during step 1704.

Advantages of some embodiments include performing, in parallel, at-speed scan testing of a high-frequency domain using an OCC and a low-frequency domain without using an OCC, while using a single pin or pad for receiving an ATE clock. Some embodiments advantageously allow for better controllability and debug by testing low frequency domains from an external (e.g., ATE) clock received in a pin or pad in a low pin count test environment and allow for test time reduction by running the at-speed scan testing of the low frequency domain in LOS (or pipeline LOS) mode and in parallel with performing at-speed testing of the high-frequency domain.

Advantages of some embodiments include performing at-speed scan testing of a low-frequency domain in parallel with performing stuck-at scan testing of a high-frequency domain while using a single pin or pad for receiving an ATE clock. Some embodiments advantageously allow for test time reduction by checking non-functional paths of the high-frequency domain using stuck-at scan testing along with performing at-speed scan testing of the low-frequency domain using LOS mode.

Example embodiments of the present invention are summarized here. Other embodiments can also be understood from the entirety of the specification and the claims filed herein.

Example 1. A method for performing scan testing of an integrated circuit, the method including: receiving a first clock signal from a first pin or pad of the integrated circuit, the first clock signal having a first frequency; receiving a scan enable signal from a second pin or pad of the integrated circuit; generating a second clock signal, the second clock signal having a second frequency at least one order of magnitude higher than the first frequency; generating a first scan clock signal based on the first clock signal and the scan enable signal; generating a second scan clock signal based on the first clock signal, the second clock signal, and the scan enable signal, where the first and second scan clock signals are generated in parallel; providing the first scan clock signal to a first scan chain, where the first scan clock signal includes a first shift pulse when the scan enable signal is asserted, and a first capture pulse when the scan enable signal is deasserted, where the first shift pulse of the first scan clock signal corresponds to a first clock pulse of the first clock signal, and where the first capture pulse of the first scan clock signal corresponds to a second clock pulse of the first clock signal; providing the scan enable signal to a second scan chain; and providing the second scan clock signal to a second scan chain, where the second scan clock signal includes a first shift pulse when the scan enable signal is asserted, and a first capture pulse when the scan enable signal is deasserted, where the first shift pulse of the second scan clock signal corresponds to the first clock pulse of the first clock signal, and where the first capture pulse of the second scan clock signal corresponds to a first clock pulse of the second clock signal.

Example 2. The method of example 1, where the first clock signal includes a third clock pulse, the third clock pulse of the first clock signal occurring after the second clock pulse of the first clock signal and while the scan enable signal is deasserted, the method further including keeping the first scan clock signal at the same level from a last edge of the first capture pulse of the first scan clock signal and until the scan enable signal is asserted.

Example 3. The method of one of examples 1 or 2, where the first clock signal includes a third clock pulse and a fourth clock pulse following the third clock pulse, the third clock pulse of the first clock signal occurring after the scan enable signal transitions from being deasserted to being asserted, the method further including: keeping the first scan clock signal at the same level from a last edge of the first capture pulse of the first scan clock signal and until a first edge of the fourth clock pulse of the first clock signal; and keeping the second scan clock signal at the same level from a last edge of the first capture pulse of the second scan clock signal and until the first edge of the fourth clock pulse of the first clock signal.

Example 4. The method of one of examples 1 to 3, where generating the first scan clock signal includes using a clock control circuit including: a first flip-flop having an input coupled to the second pin or pad; a first inverter having an input coupled to the second pin or pad; a second flip-flop having an input coupled to an output of the first inverter; a first logic circuit having a first input coupled to an output of the first flip-flop, and a second input coupled to an output of the second flip-flop; and a first clock gating circuit having an enable input coupled to an output of the first logic circuit, a clock input coupled to the first pin or pad, and an output generating the first scan clock signal.

Example 5. The method of one of examples 1 to 4, further including receiving a test mode signal indicative of whether the integrated circuit is in scan mode, where the first logic circuit includes: a first OR gate having a first input coupled to the output of the first flip-flop, and a second input coupled to the output of the second flip-flop; an XNOR gate having a first input coupled to the second pin or pad or to a first node receiving an internal scan enable signal, and a second input coupled to an output of the first OR gate, where the internal scan enable signal is based on the scan enable signal; and a first AND gate having a first input receiving the test mode signal, a second input coupled to an output of the XNOR gate, and an output coupled to the enable input of the first clock gating circuit, and where the clock control circuit further includes: a second inverter having an input receiving the test mode signal, a second clock gating circuit having an enable input coupled to an output of the second inverter, and a second OR gate having a first input coupled to the output of the first clock gating circuit, a second input coupled to an output of the second clock gating circuit, and an output coupled to the first scan chain.

Example 6. The method of one of examples 1 to 5, where generating the second scan clock signal includes using an on-chip clock controller, and where the output of the first logic circuit is coupled to the on-chip clock controller.

Example 7. The method of one of examples 1 to 6, where the clock control circuit further includes a third flip-flop having an input coupled to the output of first logic circuit, a clock input coupled to the first pin or pad, and an output coupled to the on-chip clock controller.

Example 8. The method of one of examples 1 to 7, where the clock control circuit further includes: a third flip-flop having a data input coupled to the second pin or pad, and a clock input coupled to the first pin or pad; and a first OR gate having a first input coupled to the second pin or pad, a second input coupled to an output of the third flip flop, and an output coupled to the input of the first inverter, to the input of the first flip-flop, and to the first scan chain.

Example 9. The method of one of examples 1 to 8, where a duty cycle of the second clock pulse of the first clock signal is the same or lower than a duty cycle of the first clock pulse of the first clock signal.

Example 10. The method of one of examples 1 to 9, where the duty cycle of the second clock pulse of the first clock signal is 50% or lower than 10%.

Example 11. The method of one of examples 1 to 10, where the duty cycle of the first clock pulse of the first clock signal is 50%.

Example 12. The method of one of examples 1 to 11, further including providing the scan enable signal to the first scan chain.

Example 13. The method of one of examples 1 to 12, further including: generating an internal scan enable signal based on the scan enable signal and first clock signal, where the internal scan enable signal is asserted simultaneously with the scan enable signal, and where the internal scan enable signal is deasserted after the scan enable signal based on a clock edge of the first clock signal; and providing the internal scan enable signal to the first scan chain.

Example 14. The method of one of examples 1 to 13, where the scan enable signal being asserted includes the scan enable signal being high, and where the scan enable signal being deasserted includes the scan enable signal being low.

Example 15. The method of one of examples 1 to 14, where the first frequency is lower than 10 MHz, and where the second frequency is higher than 100 MHz.

Example 16. A method including: receiving a first clock signal from a first pin or pad of an integrated circuit; receiving a scan enable signal from a second pin or pad of the integrated circuit; generating a first scan clock signal based on the first clock signal and the scan enable signal; generating a second scan clock signal based on the first clock signal and the scan enable signal, where the first and second scan clock signals are generated in parallel; providing the scan enable signal and the first scan clock signal to a first scan chain to check transition faults in a first circuit of the integrated circuit using launch-on-shift (LOS) mode, where: when the scan enable signal is asserted, each clock pulse of the first clock signal has a corresponding pulse in the first scan clock signal, and each clock pulse of the first clock signal has a corresponding pulse in the second scan clock signal; and when the scan enable signal is deasserted, each clock pulse of the first clock signal has a corresponding pulse in one of the first and second scan clock signals and does not have a corresponding pulse in the other of the first and second scan clock signals.

Example 17. The method of example 16, where generating the first and second scan clock signals includes generating the first and second scan clock signals during a first scan test, where, the first clock signal has a first frequency during the first scan test, the method further including, during a second scan test, generating a second clock signal, the second clock signal having a second frequency at least one order of magnitude higher than the first frequency; generating a third scan clock signal based on the first clock signal, the second clock signal, and the scan enable signal; and providing the scan enable signal and the third scan clock signal to a second scan chain to check transition faults in the first circuit of the integrated circuit using launch-on-capture (LOC) mode, where the second scan test is performed before or after the first scan test.

Example 18. An integrated circuit including: a first pin or pad configured to receive a first clock signal, the first clock signal having a first frequency; a second pin or pad configured to receive a scan enable signal; a phase-locked loop (PLL) configured to generate, at an output of the PLL, a second clock signal, the second clock signal having a second frequency at least one order of magnitude higher than the first frequency; a clock control circuit having a first input coupled to the first pin or pad, a second input coupled to the second pin or pad, and an output; an on-chip clock controller having a first input coupled to the first pin or pad, a second input coupled to the second pin or pad, and a third input coupled the output of the PLL, and an output; a first scan chain having a first input coupled to the output of the clock control circuit, and a second input coupled to the second pin or pad; a first circuit coupled to the first scan chain; a second scan chain having a first input coupled to the output of the on-chip clock controller, and a second input coupled to the second pin or pad; and a second circuit coupled to the second scan chain, where the clock control circuit is configured to generate, at the output of the clock control circuit, a first scan clock signal based on the first clock signal and the scan enable signal to check transition faults in the first circuit using launch-on-shift (LOS) mode or pipeline LOS mode, where the on-chip clock controller is configured to generate, at the output of the on-chip clock controller, a second scan clock signal based on the first clock signal, the second clock signal, and the scan enable signal to check transition faults in the second circuit using launch-on-capture (LOC) mode, and where the clock control circuit and the on-chip clock controller are configured to generate the first and second scan clock signals in parallel.

Example 19. The integrated circuit of example 18, where: the first scan clock signal includes a first shift pulse when the scan enable signal is asserted, and a first capture pulse when the scan enable signal is deasserted, where the first shift pulse of the first scan clock signal corresponds to a first clock pulse of the first clock signal, and where the first capture pulse of the first scan clock signal corresponds to a second clock pulse of the first clock signal; and the second scan clock signal includes a first shift pulse when the scan enable signal is asserted, and a first capture pulse when the scan enable signal is deasserted, where the first shift pulse of the second scan clock signal corresponds to the first clock pulse of the first clock signal, and where the first capture pulse of the second scan clock signal corresponds to a first clock pulse of the second clock signal.

Example 20. The integrated circuit of one of examples 18 or 19, where the clock control circuit includes: a first flip-flop having an input coupled to the second pin or pad; a first inverter having an input coupled to the second pin or pad; a second flip-flop having an input coupled to an output of the first inverter; a first logic circuit having a first input coupled to an output of the first flip-flop, and a second input coupled to an output of the second flip-flop; and a first clock gating circuit having an enable input coupled to an output of the first logic circuit, a clock input coupled to the first pin or pad, and an output generating the first scan clock signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for performing scan testing of an integrated circuit, the method comprising:
   receiving a first clock signal from a first pin or pad of the integrated circuit, the first clock signal having a first frequency;
   receiving a scan enable signal from a second pin or pad of the integrated circuit;
   generating a second clock signal, the second clock signal having a second frequency at least one order of magnitude higher than the first frequency;
   generating a first scan clock signal based on the first clock signal and the scan enable signal;
   generating a second scan clock signal based on the first clock signal, the second clock signal, and the scan enable signal, wherein the first and second scan clock signals are generated in parallel;
   providing the first scan clock signal to a first scan chain, wherein the first scan clock signal comprises a first shift pulse when the scan enable signal is asserted, and a first capture pulse when the scan enable signal is deasserted, wherein the first shift pulse of the first scan clock signal corresponds to a first clock pulse of the first clock signal, and wherein the first capture pulse of the first scan clock signal corresponds to a second clock pulse of the first clock signal;
   providing the scan enable signal to a second scan chain; and
   providing the second scan clock signal to a second scan chain, wherein the second scan clock signal comprises a first shift pulse when the scan enable signal is asserted, and a first capture pulse when the scan enable signal is deasserted, wherein the first shift pulse of the second scan clock signal corresponds to the first clock pulse of the first clock signal, and wherein the first capture pulse of the second scan clock signal corresponds to a first clock pulse of the second clock signal.

2. The method of claim 1, wherein the first clock signal comprises a third clock pulse, the third clock pulse of the first clock signal occurring after the second clock pulse of the first clock signal and while the scan enable signal is deasserted, the method further comprising keeping the first scan clock signal at the same level from a last edge of the first capture pulse of the first scan clock signal and until the scan enable signal is asserted.

3. The method of claim 1, wherein the first clock signal comprises a third clock pulse and a fourth clock pulse following the third clock pulse, the third clock pulse of the first clock signal occurring after the scan enable signal transitions from being deasserted to being asserted, the method further comprising:
   keeping the first scan clock signal at the same level from a last edge of the first capture pulse of the first scan clock signal and until a first edge of the fourth clock pulse of the first clock signal; and
   keeping the second scan clock signal at the same level from a last edge of the first capture pulse of the second scan clock signal and until the first edge of the fourth clock pulse of the first clock signal.

4. The method of claim 1, wherein generating the first scan clock signal comprises using a clock control circuit comprising:
   a first flip-flop having an input coupled to the second pin or pad;
   a first inverter having an input coupled to the second pin or pad;
   a second flip-flop having an input coupled to an output of the first inverter;
   a first logic circuit having a first input coupled to an output of the first flip-flop, and a second input coupled to an output of the second flip-flop; and
   a first clock gating circuit having an enable input coupled to an output of the first logic circuit, a clock input coupled to the first pin or pad, and an output generating the first scan clock signal.

5. The method of claim 4, further comprising receiving a test mode signal indicative of whether the integrated circuit is in scan mode, wherein the first logic circuit comprises:
   a first OR gate having a first input coupled to the output of the first flip-flop, and a second input coupled to the output of the second flip-flop;
   an XNOR gate having a first input coupled to the second pin or pad or to a first node receiving an internal scan enable signal, and a second input coupled to an output of the first OR gate, wherein the internal scan enable signal is based on the scan enable signal; and
   a first AND gate having a first input receiving the test mode signal, a second input coupled to an output of the XNOR gate, and an output coupled to the enable input of the first clock gating circuit, and wherein the clock control circuit further comprises:
   a second inverter having an input receiving the test mode signal,
   a second clock gating circuit having an enable input coupled to an output of the second inverter,
   and a second OR gate having a first input coupled to the output of the first clock gating circuit, a second input coupled to an output of the second clock gating circuit, and an output coupled to the first scan chain.

6. The method of claim 4, wherein generating the second scan clock signal comprises using an on-chip clock controller, and wherein the output of the first logic circuit is coupled to the on-chip clock controller.

7. The method of claim 6, wherein the clock control circuit further comprises a third flip-flop having an input coupled to the output of first logic circuit, a clock input coupled to the first pin or pad, and an output coupled to the on-chip clock controller.

8. The method of claim 4, wherein the clock control circuit further comprises:
- a third flip-flop having a data input coupled to the second pin or pad, and a clock input coupled to the first pin or pad; and
- a first OR gate having a first input coupled to the second pin or pad, a second input coupled to an output of the third flip flop, and an output coupled to the input of the first inverter, to the input of the first flip-flop, and to the first scan chain.

9. The method of claim 1, wherein a duty cycle of the second clock pulse of the first clock signal is the same or lower than a duty cycle of the first clock pulse of the first clock signal.

10. The method of claim 9, wherein the duty cycle of the second clock pulse of the first clock signal is 50% or lower than 10%.

11. The method of claim 10, wherein the duty cycle of the first clock pulse of the first clock signal is 50%.

12. The method of claim 1, further comprising providing the scan enable signal to the first scan chain.

13. The method of claim 1, further comprising:
- generating an internal scan enable signal based on the scan enable signal and first clock signal, wherein the internal scan enable signal is asserted simultaneously with the scan enable signal, and wherein the internal scan enable signal is deasserted after the scan enable signal based on a clock edge of the first clock signal; and
- providing the internal scan enable signal to the first scan chain.

14. The method of claim 1, wherein the scan enable signal being asserted comprises the scan enable signal being high, and wherein the scan enable signal being deasserted comprises the scan enable signal being low.

15. The method of claim 1, wherein the first frequency is lower than 10 MHz, and wherein the second frequency is higher than 100 MHz.

16. A method comprising:
- receiving a first clock signal from a first pin or pad of an integrated circuit;
- receiving a scan enable signal from a second pin or pad of the integrated circuit;
- generating a first scan clock signal based on the first clock signal and the scan enable signal;
- generating a second scan clock signal based on the first clock signal and the scan enable signal, wherein the first and second scan clock signals are generated in parallel;
- providing the scan enable signal and the first scan clock signal to a first scan chain to check transition faults in a first circuit of the integrated circuit using launch-on-shift (LOS) mode, wherein:
  - when the scan enable signal is asserted, each clock pulse of the first clock signal has a corresponding pulse in the first scan clock signal, and each clock pulse of the first clock signal has a corresponding pulse in the second scan clock signal; and
  - when the scan enable signal is deasserted, each clock pulse of the first clock signal has a corresponding pulse in one of the first and second scan clock signals and does not have a corresponding pulse in the other of the first and second scan clock signals.

17. The method of claim 16, wherein generating the first and second scan clock signals comprises generating the first and second scan clock signals during a first scan test, wherein, the first clock signal has a first frequency during the first scan test, the method further comprising, during a second scan test,
- generating a second clock signal, the second clock signal having a second frequency at least one order of magnitude higher than the first frequency;
- generating a third scan clock signal based on the first clock signal, the second clock signal, and the scan enable signal; and
- providing the scan enable signal and the third scan clock signal to a second scan chain to check transition faults in the first circuit of the integrated circuit using launch-on-capture (LOC) mode, wherein the second scan test is performed before or after the first scan test.

18. An integrated circuit comprising:
- a first pin or pad configured to receive a first clock signal, the first clock signal having a first frequency;
- a second pin or pad configured to receive a scan enable signal;
- a phase-locked loop (PLL) configured to generate, at an output of the PLL, a second clock signal, the second clock signal having a second frequency at least one order of magnitude higher than the first frequency;
- a clock control circuit having a first input coupled to the first pin or pad, a second input coupled to the second pin or pad, and an output;
- an on-chip clock controller having a first input coupled to the first pin or pad, a second input coupled to the second pin or pad, and a third input coupled the output of the PLL, and an output;
- a first scan chain having a first input coupled to the output of the clock control circuit, and a second input coupled to the second pin or pad;
- a first circuit coupled to the first scan chain;
- a second scan chain having a first input coupled to the output of the on-chip clock controller, and a second input coupled to the second pin or pad; and
- a second circuit coupled to the second scan chain, wherein the clock control circuit is configured to generate, at the output of the clock control circuit, a first scan clock signal based on the first clock signal and the scan enable signal to check transition faults in the first circuit using launch-on-shift (LOS) mode or pipeline LOS mode, wherein the on-chip clock controller is configured to generate, at the output of the on-chip clock controller, a second scan clock signal based on the first clock signal, the second clock signal, and the scan enable signal to check transition faults in the second circuit using launch-on-capture (LOC) mode, and wherein the clock control circuit and the on-chip clock controller are configured to generate the first and second scan clock signals in parallel.

19. The integrated circuit of claim 18, wherein:
the first scan clock signal comprises a first shift pulse when the scan enable signal is asserted, and a first capture pulse when the scan enable signal is deasserted, wherein the first shift pulse of the first scan clock signal corresponds to a first clock pulse of the first clock signal, and wherein the first capture pulse of the first scan clock signal corresponds to a second clock pulse of the first clock signal; and the second scan clock signal comprises a first shift pulse when the scan enable signal is asserted, and a first capture pulse when the scan enable signal is deasserted, wherein the first shift pulse of the second scan clock signal corresponds to the first clock pulse of the first clock signal, and wherein the first capture pulse of the second scan clock signal corresponds to a first clock pulse of the second clock signal.

20. The integrated circuit of claim 18, wherein the clock control circuit comprises:

a first flip-flop having an input coupled to the second pin or pad;

a first inverter having an input coupled to the second pin or pad;

a second flip-flop having an input coupled to an output of the first inverter;

a first logic circuit having a first input coupled to an output of the first flip-flop, and a second input coupled to an output of the second flip-flop; and a first clock gating circuit having an enable input coupled to an output of the first logic circuit, a clock input coupled to the first pin or pad, and an output generating the first scan clock signal.

* * * * *